(12) United States Patent
Maruyama

(10) Patent No.: US 8,936,371 B2
(45) Date of Patent: Jan. 20, 2015

(54) WAFER LEVEL LENS, PRODUCTION METHOD OF WAFER LEVEL LENS, AND IMAGING UNIT

(71) Applicant: FUJIFILM Corporation, Minato-ku, Tokyo (JP)

(72) Inventor: Yoichi Maruyama, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/279,524

(22) Filed: May 16, 2014

(65) Prior Publication Data

US 2014/0246566 A1 Sep. 4, 2014

Related U.S. Application Data

(62) Division of application No. 13/390,191, filed as application No. PCT/JP2010/063686 on Aug. 12, 2010, now abandoned.

(30) Foreign Application Priority Data

| Aug. 13, 2009 | (JP) | 2009-187858 |
| Sep. 9, 2009 | (JP) | 2009-208365 |
| Sep. 9, 2009 | (JP) | 2009-208366 |
| Sep. 9, 2009 | (JP) | 2009-208367 |
| Aug. 11, 2010 | (JP) | 2010-180625 |
| Aug. 11, 2010 | (JP) | 2010-180626 |
| Aug. 11, 2010 | (JP) | 2010-180627 |
| Aug. 11, 2010 | (JP) | 2010-180628 |

(51) Int. Cl.
*G02B 27/00* (2006.01)
*G02B 1/11* (2006.01)
(Continued)

(52) U.S. Cl.
CPC ............... *G02B 1/11* (2013.01); *G02B 3/0031* (2013.01); *G02B 7/022* (2013.01); *B29D 11/00009* (2013.01); *G02B 13/0085* (2013.01); *H01L 27/14627* (2013.01); *G02B 13/001* (2013.01)
USPC .......................................... 359/601; 359/891

(58) Field of Classification Search
CPC ................... G02F 1/133512; G02F 1/133502; G02B 1/11; G02B 1/118; G02B 5/0278; G02B 5/20; G02B 1/10; G02B 13/0085; G02B 1/04; G02B 1/111; G02B 1/115; G02B 26/008; G02B 5/003; G02B 1/041
USPC ........... 359/601, 891; 349/106, 108; 348/271, 348/276, 277; 252/582
See application file for complete search history.

(56) References Cited

U.S. PATENT DOCUMENTS

2002/0149709 A1 10/2002 Uchiyama et al.
2003/0081312 A1 5/2003 Nemoto et al.
(Continued)

FOREIGN PATENT DOCUMENTS

| CN | 1417596 A | 5/2003 |
| CN | 1912679 A | 2/2007 |

(Continued)

OTHER PUBLICATIONS

International Search Report (PCT/ISA/210) issued Oct. 26, 2010, in PCT/JP2010/063686.
(Continued)

*Primary Examiner* — William Choi
*Assistant Examiner* — Sharrief Broome
(74) *Attorney, Agent, or Firm* — Sughrue Mion, PLLC

(57) ABSTRACT

A sufficient light-shielding property is obtained by a wafer level lens having at least one lens module having a substrate and a plurality of lenses formed on the substrate in which the wafer level lens has a black resist layer formed on the surface of the lens module or on the surface of the substrate and the black resist layer is formed with a pattern having an opening at a part intersecting the optical axis of the lens, and generation of defects such as ghosts, flares and the like due to a reflected light can be prevented and an increase in the production cost can be suppressed.

23 Claims, 11 Drawing Sheets

(51) Int. Cl.
  *G02B 3/00* (2006.01)
  *G02B 7/02* (2006.01)
  *B29D 11/00* (2006.01)
  *G02B 13/00* (2006.01)
  *H01L 27/146* (2006.01)

(56) References Cited

U.S. PATENT DOCUMENTS

| | | | |
|---|---|---|---|
| 2005/0002105 A1* | 1/2005 | Nemoto et al. | 359/619 |
| 2006/0036023 A1* | 2/2006 | Kamata et al. | 524/556 |
| 2006/0044450 A1 | 3/2006 | Wolterink et al. | |
| 2009/0185291 A1 | 7/2009 | Tsuchiya et al. | |
| 2010/0118182 A1 | 5/2010 | Fujii et al. | |

FOREIGN PATENT DOCUMENTS

| | | |
|---|---|---|
| CN | 1928715 A | 3/2007 |
| CN | 101354447 A | 1/2009 |
| CN | 101382631 A | 3/2009 |
| CN | 101493563 A | 7/2009 |
| JP | 64-040901 A | 2/1989 |
| JP | 02-050101 A | 2/1990 |
| JP | 10-311904 A | 11/1998 |
| JP | 03-075607 A | 3/2003 |
| JP | 2004-198542 A | 7/2004 |
| JP | 2005-037884 A | 2/2005 |
| JP | 2005-352062 A | 12/2005 |
| JP | 2005-539276 A | 12/2005 |
| JP | 2006-058720 A | 3/2006 |
| JP | 2007-322898 A | 12/2007 |
| JP | 2009-028952 A | 2/2009 |
| JP | 2009-031415 A | 2/2009 |
| WO | 0 203 136 A1 | 1/2002 |
| WO | 02-03136 A1 | 1/2002 |
| WO | 2007-0107025 A1 | 9/2007 |
| WO | 2008/093516 A1 | 8/2008 |

OTHER PUBLICATIONS

Written Opinion (PCT/ISA/237) issued Oct. 26, 2010, in PCT/JP2010/063686.
Office Action issued Aug. 27, 2013, by the Japan Patent Office in corresponding Japanese Application No. 2010-180628.
Office Action issued Aug. 27, 2013, by the Japan Patent Office in corresponding Japanese Application No. 2010-180627.
Office Action issued Aug. 27, 2013, by the Japan Patent Office in corresponding Japanese Application No. 2010-180626.
Office Action issued Aug. 27, 2013, by the Japan Patent Office in corresponding Japanese Application No. 2010-180625.
Office Action dated Jan. 21, 2014 issued by the Japanese Patent Office in counterpart Japanese Patent Application No. 2010-180625.
Office Action dated Jan. 28, 2014 issued by the Japanese Patent Office in counterpart Japanese Patent Application No. 2010-180626.
Office Action dated Jan. 28, 2014 issued by the Japanese Patent Office in counterpart Japanese Patent Application No. 2010-180627.
Office Action dated Jan. 28, 2014 issued by the Japanese Patent Office in counterpart Japanese Patent Application No. 2010-180628.
Communication dated Dec. 4, 2013, issued by the State Intellectual Property Office of the People's Republic of China in corresponding Application No. 201080035795.X.
Examiner's Opinion dated May 27, 2014 issued by the Japanese Patent Office in corresponding Japanese Application No. 2014-7297.
Examiner's Opinion dated Jun. 3, 2014 issued by the Japanese Patent Office in corresponding Japanese Application No. 2014-007915.
Office Action issued Aug. 1, 2014, by the State Intellectual Property Office of PR China, in corresponding Chinese Application No. 201080035795.X.

* cited by examiner

WAFER LEVEL LENS, PRODUCTION METHOD OF WAFER LEVEL LENS, AND IMAGING UNIT

This is a Divisional Application of U.S. application Ser. No. 13/390,191, filed Feb. 13, 2012, which is a National Stage Entry of PCT/JP2010/063686 filed Aug. 12, 2010, which claims priority under 35 U.S.C. §119, from JP Application Nos. 2009-187858, filed Aug. 12, 2009; JP 2009-208365, filed Sep. 9, 2009; JP 2009-208366, filed Sep. 9, 2009; JP 2009-208367, filed Sep. 9, 2009; JP 2010-180625 filed Aug. 11, 2010; JP 2010-180626, filed Aug. 11, 2010; JP Application No. 2010-180627 filed Aug. 11, 2010 and JP 2010-180628 filed Aug. 11, 2010, the disclosures of which are incorporated herein by reference.

TECHNICAL FIELD

The present invention relates to a wafer level lens, a production method of a wafer level lens, and an imaging unit.

BACKGROUND ART

Presently, a portable terminal of electronic instruments such as cellular phones, PDAs (Personal Digital Assistants) and the like is loaded with a small and thin imaging unit. Such an imaging unit is generally equipped with a solid state imaging device such as a CCD (Charge Coupled Device) image sensor, a CMOS (Complementary Metal-Oxide Semiconductor) image sensor and the like, and a lens for forming a subject image on the solid state imaging device.

With reduction in size and thickness of a portable terminal, reduction in size and thickness of an imaging unit is requested. For lowering the cost of a portable terminal, an efficient production process is desired. As the method of producing a lot of such small lenses, there is known a method in which a wafer level lens having a constitution containing a plurality of lenses molded on a substrate is produced, and the substrate is cut to separate the plurality of lenses, to produce a lot of lens modules.

There is also known a method in which a substrate carrying a plurality of lenses formed thereon and sensor substrate carrying a plurality of solid state imaging devices formed thereof are integrally combined, and the substrate and the sensor substrate are together cut so as to include the lens and the solid stage imaging device as a set, to produce a lot of imaging units.

In the past, examples of the wafer level lens include those shown in the following patent documents.

A patent document 1 (JP-A-2005-539276) describes the constitution of a multi-layered wafer level lens obtained by laminating substrates carrying a plurality of lenses formed thereon.

A patent document 2 (WO-07/107,025) describes a method of feeding a molding material on a substrate, and molding a lens on the substrate using a mold.

SUMMARY OF INVENTION

In the wafer level lens, both a substrate and a lens are constituted of transparent materials allowing transmission of light, and light can penetrate any part thereof. Owing to this constitution, if a wafer level lens is diced and placed on an imaging device to give an imaging unit and when light transmission and reflection occur at a region other than the lens surface of the lens, there is a fear of tendency of defects in optical performances such as ghosts and flares in taking an image. For preventing such defects, there is for example envisaged a procedure of separately attaching a light shielding member to a region other than the lens of the wafer level lens.

Originally, the wafer level lens has a big profit of suppressing production cost since a plurality of lenses are simultaneously molded on a substrate, and the substrate is diced and connected to a semiconductor substrate carrying thereon an imaging device, and the like. However, if a light shielding member is separately attached, an increase in the production cost corresponding to this process is inevitable.

The present invention provides a wafer level lens with which a sufficient light shielding property is obtained, generation of defects such as ghosts, flares and the like due to a reflected light can be prevented, and an increase in the production cost can be suppressed; a production method of a wafer level lens, and an imaging unit.

The present invention provides a wafer level lens having at least one lens module having a substrate and a plurality of lenses formed on said substrate, in which the wafer level lens has a black resist layer formed on the surface of said lens module or on the surface of said substrate, and said black resist layer is formed with a pattern having an opening at a part intersecting the optical axis of said lens.

In this wafer level lens, light transmission at a region other than the lens surface of the lens can be prevented by the black resist layer patterned on at least one of the surface of the lens module and the surface of the substrate. Because of this constitution, generation of defects such as ghosts and flares in taking an image can be prevented, when applied to an imaging module equipped with an imaging device.

Since the black resist layer is patterned on the surface of the lens module or the substrate, there is no necessity to attach another light shielding member and the like to the wafer level lens and an increase in the production cost can be suppressed.

The present invention provides a method of producing a wafer level lens having at least one lens module having a substrate and a plurality of lenses formed on said substrate, in which before formation of said lenses on said substrate, a black resist layer is coated on the surface of the substrate, said coated black resist layer is formed with a pattern having an opening at a part intersecting the optical axis of said lens, then, said lens is integrally molded on said substrate.

In this wafer level lens, the black resist layer having a light shielding function is first patterned on the surface of the substrate. In this case, the black resist layer can be formed with a pattern having an opening at a part intersecting the optical axis of the lens, then, a lens can be molded at a region including the opening of the black resist layer. Thus, the black resist layer becomes substantially a lens optical diaphragm.

According to this method, since also the black resist layer can be fabricated together with the lens module in the procedure of producing the wafer level lens, there is no necessity of carrying out a procedure of attaching another light shielding member and the like to the wafer level lens and an increase in the production cost can be suppressed.

The wafer level lens obtained by this method is capable of shielding light penetrating a part other than the lens since the black resist layer has a light shielding function. Accordingly, generation of defects such as ghosts and flares in taking an image can be prevented, when applied to an imaging module equipped with an imaging device.

The present invention provides a method of producing a wafer level lens having at least one lens module having a substrate and a plurality of lenses formed on said substrate, in which said lens is molded on said substrate, a black resist layer is coated on the lens surface of said lens and on the surface of said substrate, and said black resist layer is formed with a pattern having an opening at a part intersecting the optical axis of said lens.

According to the procedure of this production method of a wafer level lens, the lens is first molded on the surface of the substrate, then, the black resist layer is patterned on a region excluding the lens surface of the molded lens. Thus, since the black resist layer can be fabricated together in a process of producing the wafer level lens, there is no necessity of carrying out a process of attaching another light shielding member and the like to the produced wafer level lens and an increase in the production cost can be suppressed.

The wafer level lens obtained by this method is capable of shielding light penetrating a part other than the lens by the black resist layer. Accordingly, generation of defects such as ghosts and flares in taking an image can be prevented, when applied to an imaging module equipped with an imaging device.

The present invention provides a wafer level lens having at least one lens module having a substrate and a plurality of lenses formed on said substrate, in which the wafer level lens has a light shielding layer formed on an at least partial region of the light incidence side outermost surface of said lens module and a low reflective light shielding layer formed with a pattern having an opening at a part intersecting the optical axis of said lens, on the surface of said lens module or on the surface of said substrate other than said light incidence side outermost surface, and said light shielding layer has lower transmittance for a visible light and higher reflection rate than said low reflective light shielding layer.

In a usual glass wafer, owing to reflection at the surface and reflection of a transmitted light in the glass wafer, reflection of 5 to 10% occurs corresponding to about 2 times of the surface reflection. In contrast, this wafer level lens has a light shielding layer and a low reflective light shielding layer. The light shielding layer has a function of preventing transmission of a light in a substrate, by reflecting a light incoming from the outside of the wafer level lens. When a plurality of substrates are disposed, a light incoming from the top substrate surface is reflected by the light shielding layer at a region other than the lens, and it is possible to prevent the light penetrated through a region other than the lens from penetrating between the substrates and to the sensor substrate side.

By providing the low reflective light shielding layer, transmission of a light at a region other than the lens surface of the lens can be prevented.

By providing both the light shielding layer and the low reflective light shielding layer, a light penetrating a part other than the lens can be reflected by the light shielding layer, and even if a light penetrates into the substrate without reflection by the light shielding layer, the light can be shielded by the low reflective light shielding layer. Accordingly, generation of light transmission and reflection at a region other than the lens surface of the lens can be prevented, and defects in optical performances such as ghosts and flares in taking an image can be suppressed.

Further, since the light shielding layer and the low reflective light shielding layer are patterned on the surface of the substrate, there is no necessity to attach another light shielding member and the like to the wafer level lens and an increase in the production cost can be suppressed.

The present invention is capable of providing a wafer level lens with which a sufficient light shielding property is obtained, generation of defects such as ghosts, flares and the like due to a reflected light can be prevented, and an increase in the production cost can be suppressed; a production method of a wafer level lens, and an imaging unit.

DESCRIPTION OF EMBODIMENTS

First, the constitutions of a wafer level lens and an imaging unit will be explained.

Figure 1:
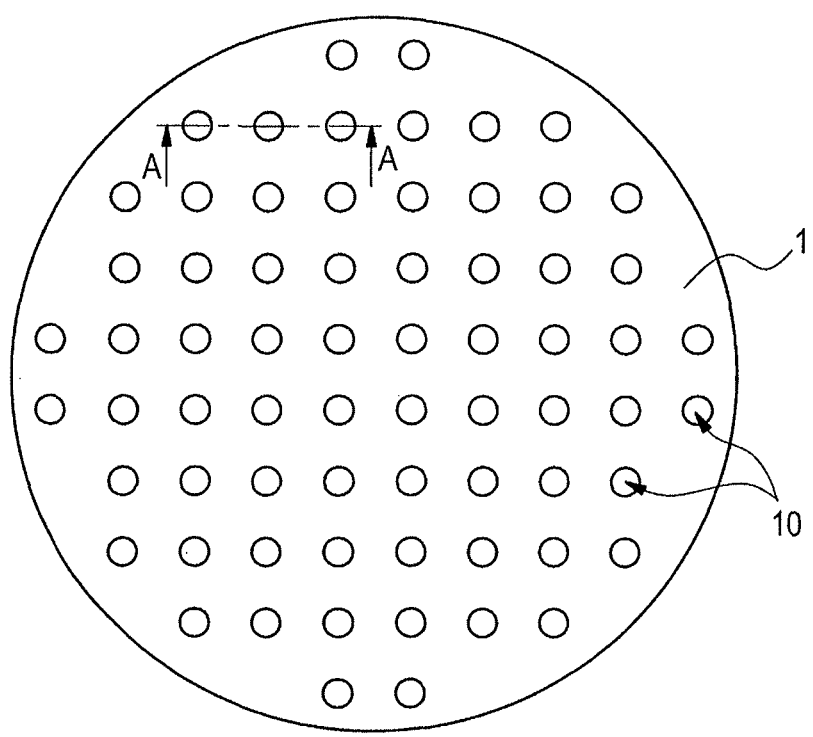
FIG. 1 is a plane view showing one examples of the constitution of a wafer level lens.
Figure 2:
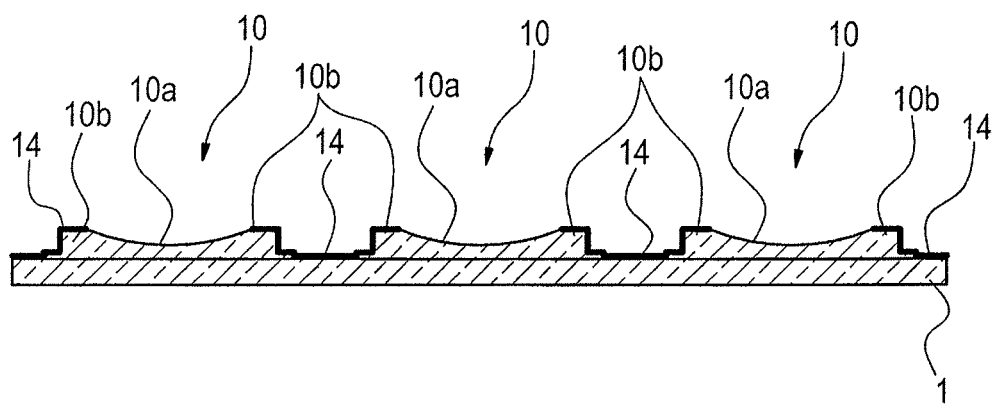
FIG. 2 is a cross-sectional view taken in a line A-A of the constitution of the wafer level lens shown in FIG. 1.

FIG. 1 is a plane view showing one example of the constitution of a wafer level lens. FIG. 2 is a cross-sectional view taken in a line A-A of the constitution of the wafer level lens shown in FIG. 1.

The wafer level lens has a lens module having a substrate 1 and a plurality of lenses 10 formed on the substrate 1. The plurality of lenses 10 are arranged on the substrate 1 in one-dimensional mode or two-dimensional mode. In this constitution example, an example of a constitution in which the plurality of lenses 10 are arranged on the substrate 1 in two-dimensional mode as in FIG. 1 will be explained. The lens 10 is constituted of the same material as for the substrate 1, and molded on the substrate 1.

As shown in FIG. 2, the lens 10 has a concave-shaped lens surface 10a and a lens marginal part 10b around the lens surface 10a. Here, the lens surface 10a has an optical property of allowing a light incoming into the lens 10 to concentrate or radiate to a desired direction, and the curvature factor and the surface shape are designed in view of this optical property. In this constitution example, the height of the lens marginal part 10b from the substrate 1 is higher than the center of the lens surface 10a. The shape of the lens 10 is not particularly restricted, and for example, a lens having a lens surface 10a protruding in a convex shape, that is, a convex-shaped lens may be used, or an aspherical lens may also be used.

In this example, a plurality of lenses 10 are disposed on one surface of the substrate 1, however, a constitution having a plurality of lenses 10 disposed on both surfaces of the substrate 1 may also be used. When a plurality of lenses 10 are disposed on both surfaces of the substrate 1, molding is so performed that the optical axis of each lens on one surface corresponds to the optical axis of each lens on another surface.

In FIG. 2, the wafer level lens has one lens module having a plurality of lenses 10 molded on the substrate 1, however, a constitution having two or more lens modules laminated may also be used.

In this wafer level lens, a black resist layer 14 is provided so as to cover the surface of the lens marginal part 10b of the lens 10 and the surface of the substrate 1 between the lenses 10. The black resist layer 14 is patterned on a region excluding the lens surface 10a of the lens, on the surface of the lens module. When the wafer level lens has a constitution of lamination of two or more lens modules, the black resist layer 14 is provided on the surface of at least one lens module. The black resist layer 14 is formed with a pattern having an opening at a part intersecting the optical axis of the lens 10. The black resist layer 14 may partially cover a peripheral part of the lens surface 10a.

Since the black resist layer 14 shows a lower light reflection rate as compared with a metal layer and the like, disadvantages such as ghosts, flares and the like due to light reflection can be reduced. The black resist layer is formed using a black resist composition. The black resist composition will be described later.

Figure 3:
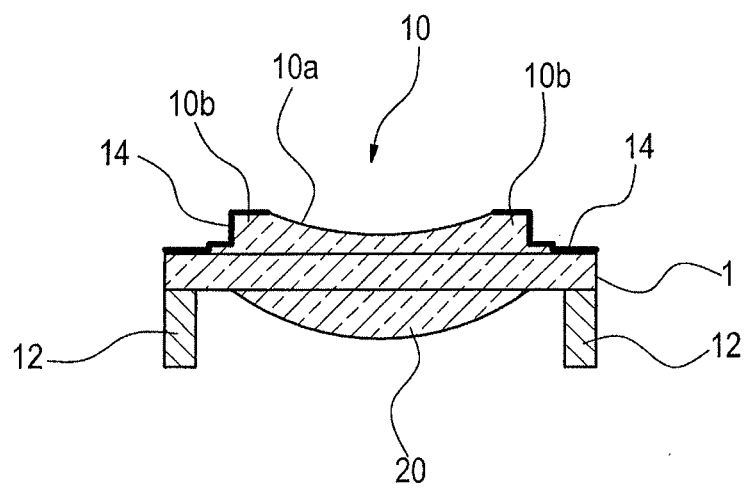
FIG. 3 is a cross-sectional view showing another constitution example of a wafer level lens.

FIG. 3 is a cross-sectional view showing another constitution example of a wafer level lens.

In this example, a lens 10 having the same shape as in FIG. 1 is formed on one surface of a substrate 1, and a convex-shaped lens 20 is molded on another surface. On the another surface, a spacer is formed for keeping a distance when laminating lens modules. The spacer 12 is a grid-shaped member in a planar view, and connected to the another surface of the substrate 1. In this example, the spacer is connected to the substrate 1 of the lens module, then, dicing is performed so as to separate one lens 10 and one lens 20 on the substrate 1. The spacer 12 may also be integrally molded to the substrate 1 as a part of the substrate 1.

Figure 4:
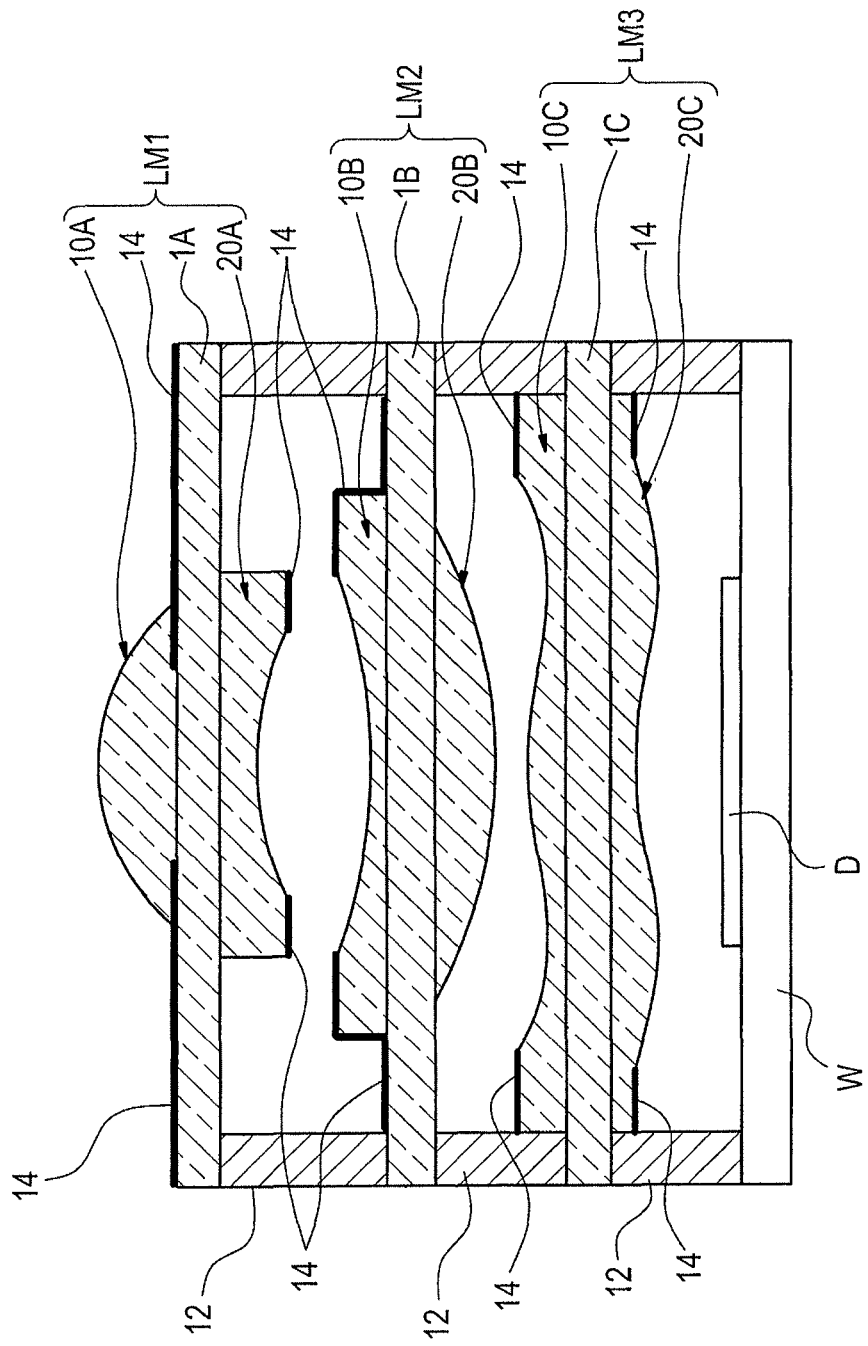
FIG. 4 is a cross-sectional view showing one example of the constitution of an imaging unit.

FIG. 4 is a cross-sectional view showing one example of the constitution of an imaging unit.

The imaging unit has lens modules separated for each lens by dicing of wafer level lenses, an imaging device (here, solid state imaging device) D, and a sensor substrate W on which the solid state imaging device D is disposed. The imaging unit of this example has a constitution in which three lens modules LM1, LM2 and LM3 are laminated in this order from the light incident side (from the upper side of FIG. 4).

In the lens module LM1, a convex-shaped lens 10A is molded on the upper surface of the substrate 1A, and a lens 20A having a concave-shaped lens surface is molded on the lower surface. On the upper surface of the substrate 1A, a black resist layer 14 is patterned on a region excluding the lens surface of the lens 10A. On the lens 20A, a black resist layer 14 is patterned on a region excluding the lens surface. The shape of patterning of the black resist layer 14 is not particularly restricted, and the black resist layer 14 may advantageously be formed with a pattern having an opening at a part intersecting the optical axis of the lenses 10A and 20A, and the same shall apply to the black resist layer 14 of the lens modules LM2 and 3.

In the lens module LM2, a concave-shaped lens 10B is molded on the upper surface of the substrate 1B, and a lens 20B having a convex-shaped lens surface is molded on the lower surface. This lens module LM2 has basically the same constitution as shown in FIG. 3. A patterned black resist layer 14 is disposed on a region excluding the lens surface of the lens 10B on the light incident side surface of the lens module LM2, that is, on the lens marginal part and a region of no lens 10B on the surface of the substrate 1B. In this example, the black resist layer 14 is not disposed on the opposite side surface of the lens module LM2, however, a patterned black resist layer 14 may be disposed on a region excluding the lens surface of the lens 20B.

In the lens module LM3, an aspherical-shaped lens 10C is molded on the upper surface of the substrate 1C, and a lens 20C having an aspherical-shaped lens surface is molded on the lower surface. On both surfaces of the lens module LM3, a patterned black resist layer 14 is disposed on a region excluding the lens surfaces of the lens 10C and the lens 20C.

The lenses 10A, 10B, 10C, 20A, 20B and 20C are disposed in the form of rotation symmetry against the optical axis. The lens modules LM1, LM2 and LM3 are connected via spacers 12 so that the optical axes of all the lenses 10A, 10B, 10C, 20A, 20B and 20C coincide.

The lens modules LM1, LM2 and LM3 are mutually connected via the spacers 12, and the lens module LM3 is connected to the sensor substrate W via the spacer 12. The lenses 10A, 10B, 10C, 20A, 20B and 20C of the lens modules LM1, LM2 and LM3 form a subject image on the solid state imaging device D disposed on the sensor substrate W.

The sensor substrate W is molded by cutting a wafer formed of a semiconductor material such as for example silicon and the like into an approximately rectangular shape in a planar view. The solid state imaging device D is disposed on an approximately center part of the sensor substrate W. The solid state imaging device D is, for example, a CCD image sensor or a CMOS image sensor. The solid state imaging device D can be obtained by making a chip, then, bonding the chip on a semiconductor substrate carrying thereon formed wiring and the like. Alternatively, known film formation, photolithography, etching and impurity adding processes and the like may be performed on the sensor substrate W, thereby forming an electrode, an insulation film, wiring and the like on the sensor substrate W, to constitute the solid state imaging device D.

The spacer 12 of the lens module LM3 and the sensor substrate W are connected, for example, using an adhesive and the like. The spacers 12 are designed so that the lenses 10A, 10B, 10C, 20A, 20B and 20C of the lens modules LM1, LM2 and LM3 form a subject image on the solid state imaging device D. The spacers 12 are formed with a height keeping a prescribed distance (length in vertical direction to the surface of the substrate) so that the lenses 10A, 10B, 10C, 20A, 20B and 20C do not mutually come into contact between overlapped lens modules LM1, LM2 and LM3 or the lens module LM3 and the sensor substrate W do not mutually come into contact.

The shape of the spacer 12 is not particularly restricted and can be appropriately changed in a range wherein the lens modules LM1, LM2 and LM3 can be kept or the lens module LM3 and the sensor substrate W can be kept in positional relation with a prescribed distance between them. For example, the spacer 12 may be a columnar member disposed at four corners of the substrates 1A, 1B and 1C. The spacer 12 may be a frame-shaped member surrounding the periphery of the solid state imaging device D. By surrounding the solid state imaging device D by the frame-shaped spacer 12 to attain insulation from the outside, light shielding can be performed so that lights other than a light penetrating the lens do not come into the solid state imaging device D. Further, by sealing the solid state imaging device D from the outside, adhesion of dusts to the solid state imaging device D can be prevented.

In the case of a constitution of lamination of the lens modules LM 1, LM 2 and LM 3 as shown in FIG. 4, a reflection layer may be provided instead of the black resist layer 14, on the surface of the top lens module LM 1 nearest to the light incident side or on the surface of the substrate 1A. It is preferable that the reflection layer has a reflection rate of 4% or less and a transmittance of 0.1% or less for a visible light (wavelength: 400-700 nm). As the reflection material, metals such as chromium (Cr), gold, tungsten, aluminum, copper, nickel, zinc, silver and the like or metal materials thereof are preferably used.

The imaging unit as constituted above is reflow-mounted on a not-shown circuit substrate embedded in a portable terminal and the like. On the circuit substrate, a paste-like solder is appropriately printed previously at a position of mounting of an imaging unit, and the imaging unit is placed on this, and the circuit substrate containing this imaging unit is subjected to a heating treatment such as infrared irradiation and hot air blowing, thereby welding the imaging unit to the circuit substrate.

Next, the black resist composition contained in the black resist layer 14 will be explained.

[Black Resist Composition]

The black resist composition of the present invention contains a black material.

As the black material, known coloring agents, metal particles or particles containing a metal can be used. As the coloring agent, black pigments and dyes can be used. Further, coloring agents of various hues may be mixed to prepare a black resist composition having desired transmittance. As these coloring agents, used can be made of known coloring agents described in JP-A No. 2006-208796, paragraph numbers [0037] to [0046] and the like, and combinations thereof. Of them, carbon black, titanium carbon, iron oxide, titanium oxide, graphite, silver-tin, silver colloid and the like are preferable from the standpoint of a high light shielding property, and especially, carbon black, silver-tin and titanium black are particularly preferable from the standpoint of a light shielding property. These black materials are dispersed, and combined with other curing components and the like to give a composition to be used.

As the example of carbon black, Pigment Black 7 (carbon black C. I. No. 77266) is preferable. As commercial products, Mitsubishi Carbon Black MA100 (manufactured by Mitsubishi Chemical Corporation) and Mitsubishi Carbon Black #5 (manufactured by Mitsubishi Chemical Corporation) are mentioned.

As the example of titanium black, TiO, TiN and a mixture containing them are preferable. As commercial products, (trade name) 12S and 13M manufactured by Mitsubishi Materials Corporation are mentioned. The average primary particle size of titanium black is preferably 5 to 100 nm, further preferably 10 to 100 nm, particularly preferably 10 to 50 nm. Though the specific surface area of titanium black is not particularly restricted, it is preferable that the value measured by a BET method is usually about 5 to 150 $m^2/g$, particularly about 20 to 100 $m^2/g$ so that the water repellency after surface-treatment of such titanium black with a water repellent agent shows a given performance.

As the example of graphite, those having an average primary particle size of 3 μm or less in terms of stokes diameter are preferable. When the average primary particle size is in the above-described range, the outline form of a light shielding pattern become uniform, and sharpness becomes excellent. It is desirable that 90% or more of particles have an average primary particle size of 0.1 μm or less. Specifically, particles obtained by screening of the average primary particle size by segmentation operations such as centrifugal separation and the like can be used.

Further, it is preferable to use metal particles or particles containing a metal as the black agent from the standpoint of a high light shielding property. The metal particles or particles containing a metal are not particularly restricted, and any compounds may be used. As the metal particles or particles containing a metal, two or more metals may be used in combination, and alloys thereof can also be used. Further, composite particles composed of a metal and a metal compound may also be used.

The metal particles include suitably particles and alloys described in JP-A No. 2006-251237, paragraph numbers [0037] to [0054]. Specifically, shape anisotropic metal fine particles are mentioned. The shape anisotropic metal fine particles are not particularly restricted providing they have a shape other than a spherical form having shape anisotropy, and preferable are metal fine particles having an infinite form such as a pellet form, a potato form and the like, a stick form (needle form, cylindrical form, prismatic form such as rectangular parallelopiped and the like, rugby ball form and the like), a flat plate form (scale form, elliptical plate form, plate form), a fiber form, a crenated form, a coil form and the like. Though the particle shape is not particularly restricted, a stick forms, an infinite forms and a plate form are more preferable.

As the metal particles or particles containing a metal, those formed from a metal or from a metal and a metal compound are preferable, and those formed from a metal are particularly preferable.

Particularly, it is preferable to contain as the main component a metal selected from the group consisting of metals of the long form periodic table (IUPAC1991), 4-th period, 5-th period and 6-th period. It is preferable to contain a metal selected from the group consisting of metals of groups II to XIV, and it is more preferable to contain as the main component a metal selected from the group consisting of metals of the group II, group VIII, group IX, group X, group XI, group XII, group XIII and group XIV. Of them, particles of metals belonging to the 4-th period, 5-th period or 6-period and belonging to the group II, group X, group XI, group XII or group IV are further preferable as the metal particle.

Preferable examples of the metal particles include at least one selected from copper, silver, gold, platinum, palladium, nickel, tin, cobalt, rhodium, iridium, iron, calcium, ruthenium, osmium, manganese, molybdenum, tungsten, niobium, tantalum, titanium, bismuth, antimony, lead and alloys thereof. Further preferable metals include copper, silver, gold, platinum, palladium, nickel, tin, cobalt, rhodium, calcium, iridium and alloys thereof, more preferable metals include at least one selected from copper, silver, gold, platinum, palladium, tin, calcium and alloys thereof, and particularly preferable metals include at least one selected from copper, silver, gold, platinum, tin and alloys thereof. Especially, silver is preferable (as the silver, colloidal silver is preferable), and particles having a silver-tin alloy are most preferable.

Examples of silver-tin include fine particles containing as the main component a silver-tin alloy and having an average particle size of 1 nm or more and 300 nm or less as described in JP-A No. 2006-227268, Japanese Patent No. 4237148 and Japanese Patent No. 4223487.

[Metal Compound Particle]

The metal compound is a compound composed of the above-described metal and other element other than metals. As the compound composed of the metal and other element, oxides, sulfides, nitrides, sulfates, carbonates and the like of metals are mentioned, and as the metal compound particle, particles of these compounds are suitable. Of them, particles of nitrides and sulfides are preferable from the standpoint of color tone and easiness of formation of fine particles.

Examples of the metal compound include copper(II) oxide, iron sulfide, silver sulfide, copper(II) sulfide, titanium black and the like, and silver sulfide is particularly preferable from the standpoint of color tone, easiness of formation of fine particles and stability.

[Composite Particle]

The composite particle means one particle obtained by binding of a metal and a metal compound. Examples thereof include those having different compositions of the inside and the surface of a particle, those obtained by combining two particles, and the like. Each of the metal compound and the metal may be used singly or in combination.

Specific examples of the composite particle composed of a metal compound and a metal include a composite particle composed of silver and silver sulfide, a composite particle composed of silver and copper(II) oxide, and the like.

In the case of use of a pigment as the coloring agent to be used in the present invention, those previously miniaturized into fine particles are preferably used. As miniaturization of pigment primary particles, a method of mechanically kneading i) a pigment, ii) a water-soluble inorganic salt and iii) a water-soluble organic solvent not substantially dissolving the inorganic salt by a kneader and the like, a so-called salt milling method and the like are well known.

[Solvent]

In the case of use of a pigment as the coloring agent of the present invention, it is preferable to first produce a pigment dispersion liquid prepared by dispersing a pigment in at least one solvent. The solvent is selected from organic solvents shown below, and selected in view of the solubility of components contained in the pigment dispersion liquid, coatability when applied to a resist composition, and the like, and there is no restriction providing that these desired physical properties are satisfied, and it is preferable to select the solvent in view of safety.

As the solvent which can be suitably used for preparation of the pigment dispersion liquid, more preferable are methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, diethylene glycol monoethyl ether acetate, diethylene glycol monobutyl ether acetate, propylene glycol methyl ether, propylene glycol monomethyl ether acetate (PGMEA) and the like.

The content of the solvent in the pigment dispersion liquid of the present invention is preferably 50 wt % to 95 wt %, more preferably 50 wt % to 90 wt %. Further, it is particularly preferably 60 to 90 wt %, most preferably 70 wt % to 90 wt %. When the content of the solvent is in the above-described range, dispersion stability is advantageous.

[Other Components]

The pigment dispersion liquid may contain other components in a range not deteriorating the effect of the present invention, according to the object such as application of the pigment dispersion liquid and the like.

It is preferable that the pigment dispersion liquid contains further a pigment derivative. Particularly, by inclusion of a pigment derivative having an acidic group, dispersibility and dispersion stability are improved dramatically.

As the acidic group carried on the pigment derivative, a sulfonic group, a carboxylic group and quaternary ammonium salts thereof are preferable. As a basic group carried on the pigment derivative, an amino group is preferable.

Though the use amount of the pigment derivative is not particularly restricted, it is preferably 5 to 50 wt %, further preferably 10 to 30 wt % based on the pigment.

It is also preferable to use a polymer material together for improving dispersibility. Specific examples of the polymer material include "Disperbyk-101 (polyamide amine phosphoric acid salt), 107 (carboxylic acid ester), 110 (copolymer containing an acidic group), 130 (polyamide), 161, 162, 163, 164, 165, 166, 170 (polymer copolymerized compound)", "BYK-P104, P105 (high molecular weight unsaturated polycarboxylic acid) manufactured by BYK Chemie, "EFKA 4047, 4050, 4010, 4165 (polyurethane type), EFKA 4330, 4340 (block copolymer), 4400, 4402 (modified polyacrylate), 5010 (polyester amide), 5765 (high molecular weight polycarboxylic acid salt), 6220 (fatty acid polyester), 6745 (phthalocyanine derivative), 6750 (azo pigment derivative)" manufactured by EFKA, "Ajisper PB821, PB822" manufactured by Ajinomoto Fine-Techno Co., Inc., "Florene TG-710 (urethane oligomer)", "Polyflow No. 50E, No. 300 (acrylic copolymer)" manufactured by Kyoeisha Chemical Co., Ltd., "Disperon KS-860, 873SN, 874, #2150 (aliphatic poly-valent carboxylic acid), #7004 (polyether ester), DA-703-50, DA-705, DA-725" manufactured by Kusumoto Chemicals, Ltd., "Demol RN, N (naphthalenesulfonic acid formalin polycondensate), MS, C, SN-B (aromatic sulfonic acid formalin polycondensate)", "Homogenol L-18 (polymer polycarboxylic acid)", "Emulgen 920, 930, 935, 985 (polyoxyethylene nonyl phenyl ether)", "Acetamin 86 (stearylamine acetate)" manufactured by Kao Corporation, "Solsperse 5000 (phthalocyanine derivative), 22000 (azo pigment derivative), 13240 (polyester amine), 3000, 17000, 27000 (polymer having a functional part at the end), 24000, 28000, 32000, 38500 (grafted polymer)" manufactured by The Lubrizol Corporation and "Nikkol T106 (polyoxyethylene sorbitan monooleate), MYS-IEX (polyoxyethylene monostearate)" manufactured by Nikko Chemicals Co., Ltd. (all are trade names), and the like. Also, amphoteric dispersing agents such as Hinoact T-8000E manufactured by Kawaken Fine Chemicals Co., Ltd., and the like are mentioned. Further, polymer compounds described for (F) alkali-soluble resin described later, and the like are mentioned.

Particularly, polymer dispersing agents having a polyester chain in the side chain are preferable from the standpoint of dispersibility, and resins having an acidic group and a polyester chain are preferable from the standpoint of dispersibility and the resolution of a pattern formed by a photolithography method. As the preferable acidic group in the pigment dispersing agent, acidic groups having a pKa of 6 or less are preferable, and carboxylic acids, sulfonic acids and phosphoric acids are particularly preferable, from the standpoint of an adsorption property.

The dispersing resins preferably used in the present invention will be explained below.

The preferable dispersing resins are graft copolymers having in the molecule a graft chain selected from a polyester structure, a polyether structure and a polyacrylate structure and having an number of atoms excluding a hydrogen atom of in the range of 40 to 10000, and graft copolymers containing a structure unit represented by any one of the following formulae (1) to (5).

[Chemical formula 1]

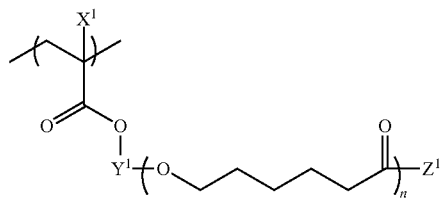

(1)

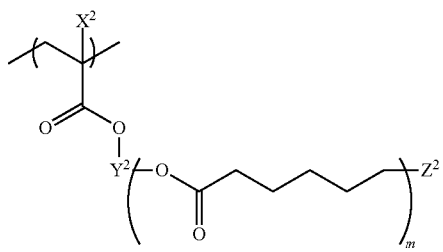

[in the formula (I) to the formula (5), $X^1$, $X^2$, $X^3$, $X^4$, $X^5$ and $X^6$ represent each independently a hydrogen atom or a monovalent organic group, $Y^1$, $Y^2$, $Y^3$, $Y^4$ and $Y^5$ represent each independently a divalent connecting group, $Z^1$, $Z^2$, $Z^3$, $Z^4$ and $Z^5$ represent each independently a hydrogen atom or a monovalent organic group. R represents a hydrogen atom or a monovalent organic group, and Rs of different structures may exist in the copolymer. n, m, p, q and r represent each independently an integer of 1 to 500.].

As specific examples, compounds shown below are mentioned. In the following exemplified compounds, the numerical value described along with each structural unit (numerical value described along with the main chain repeating unit) represents the content [wt %] of the structural unit. The numerical value described along with the side chain repeating unit represents the number of repetition of the repeating unit.

[Chemical formula 2]

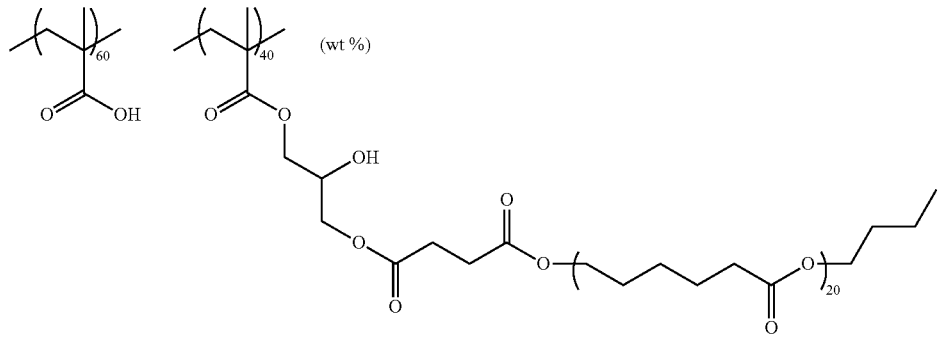

(exemplified compound 1)

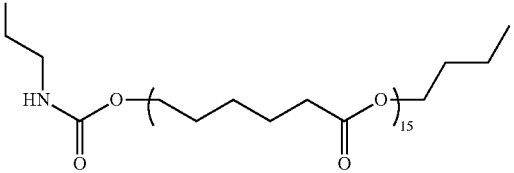

(exemplified compound 2)

(exemplified compound 3)
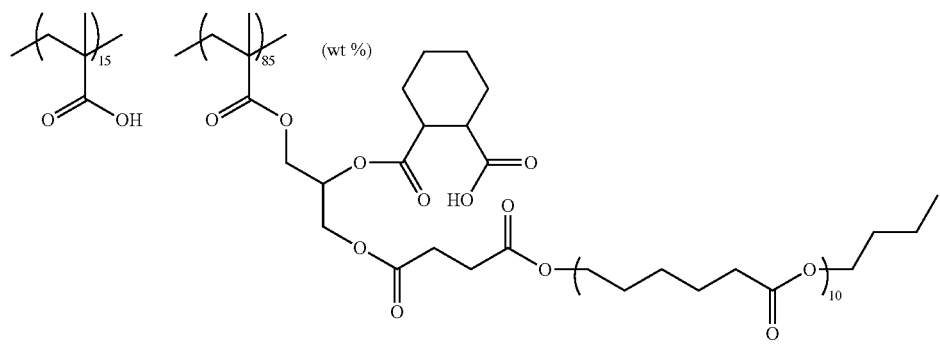
(exemplified compound 4)
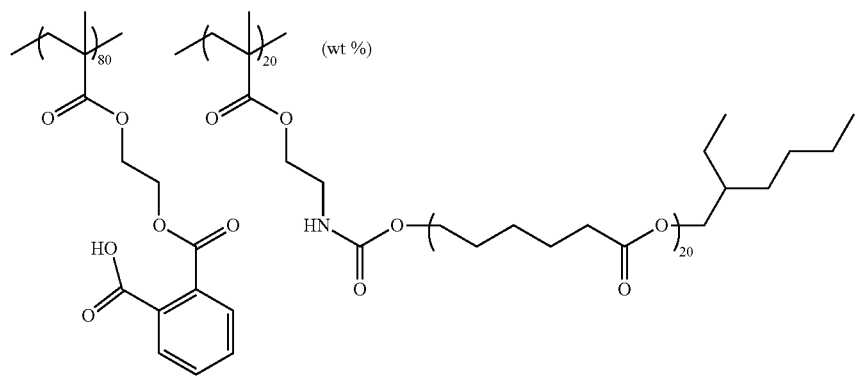
[Chemical formula 3]
(exemplified compound 5)
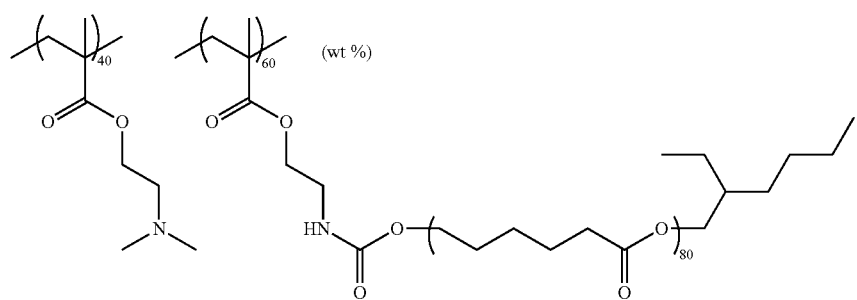
(exemplified compound 6)
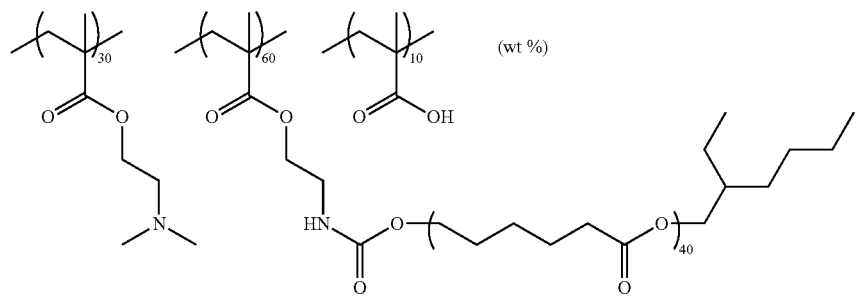

-continued
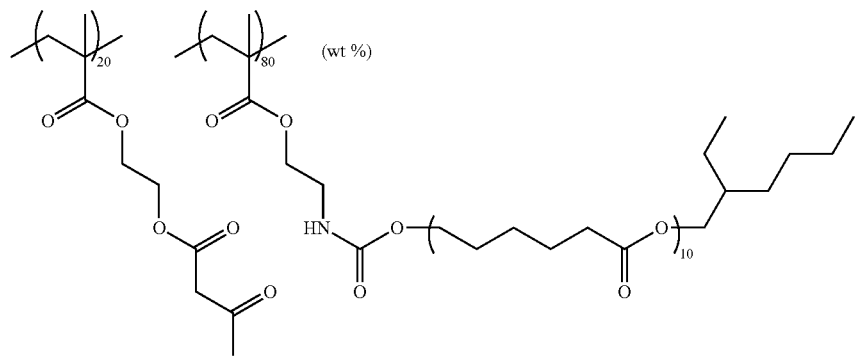
(exemplified compound 7)
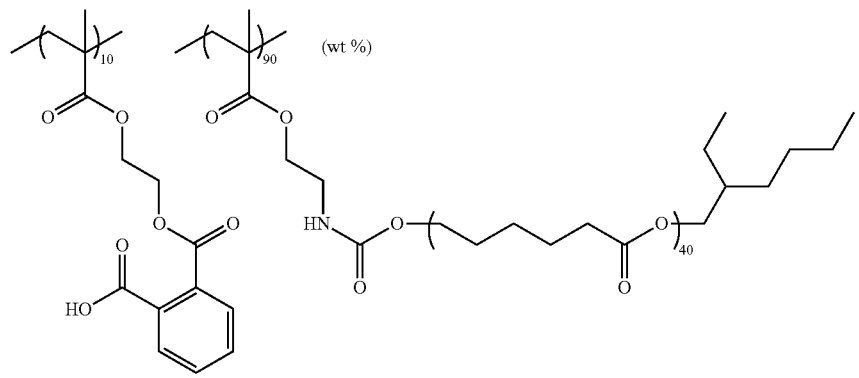
(exemplified compound 8)
[Chemical formula 4]
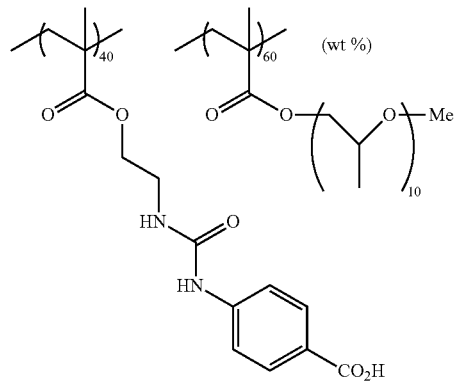
(exemplified compound 9)
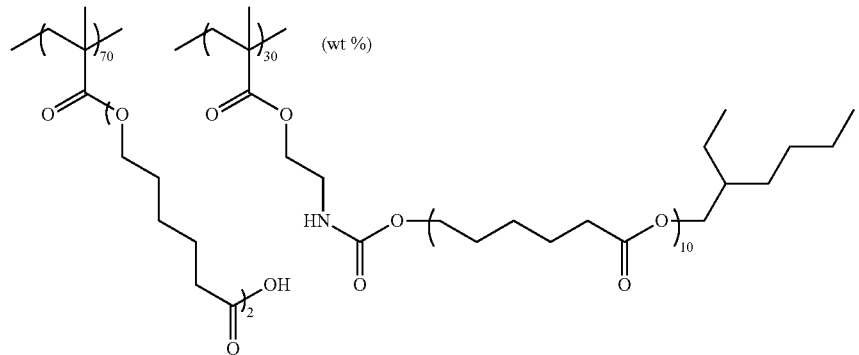
(exemplified compound 10)

In the case of use of an inorganic pigment as the black material, it is preferable to first prepare a pigment dispersed composition from a pigment, a dispersing agent and a suitable solvent, then, blend this in a polymerizable composition, from the standpoint of dispersibility.

Also in the case of use of an inorganic pigment and an infrared ray absorbing dye as the black material, dyes other than materials exemplified as the existing organic pigment having a hue of red, blue, green, yellow, cyan, magenta, gray and the like may be appropriately selected and combined, to realize a desired spectrum.

The content of the pigment dispersing agent in such a pigment dispersed composition is preferably 1 wt % to 90 wt %, more preferably 3 wt % to 70 wt % with respect to the total solid weight of the coloring agents (including the black pigment and other coloring agents) in the pigment dispersed composition.

These polymer materials may be used singly or in combination of two or more of them. When the polymer materials are used in combination, the content of the polymer materials is preferably 1 wt % to 100 wt %, more preferably 3 wt % to 80 wt %, further preferably 5 wt % to 50 wt % with respect to (A) the specified resin according to the present invention.

[Photosensitive Component]

By further adding a photosensitive component to the black material, a black resist composition is obtained. As the black resist composition, any of compositions having a positive action showing an increase in solubility of an exposed part into a developing solution by a light and compositions having a negative action showing a decrease in solubility into a developing solution can be adopted. For example, by adding a photopolymerization initiator and a compound containing an ethylenically unsaturated double bond as the photosensitive component, a black resist composition excellent in resolution, chromatic characteristic, coatability and developing property can be obtained.

(Photopolymerization Initiator)

It is preferable that the black resist composition contains a photopolymerization initiator for improving sensitivity and pattern formability. The photopolymerization initiator in the present invention is a compound which is decomposed by a light to initiate and promote polymerization of polymerizable components in the present invention, and those showing absorption in the wavelength range of 300 nm to 500 nm are preferable. The photopolymerization initiators can be used singly or in combination of two or more of them.

As the photopolymerization initiator, compounds selected from the group consisting of triazine compounds, alkylamino compounds, benzyl dimethyl ketal compounds, α-hydroxyketone compounds, α-aminoketone compounds, acylphosphine compounds, phosphine oxide compounds, metallocene compounds, oxime compounds, biimidazole compounds, onium compounds, benzothiazole compounds, benzophenone compounds, acetophenone compounds and derivatives thereof, cyclopentadiene-benzene-iron complexes and salts thereof, halomethyloxadiazole compounds and 3-aryl-substituted coumarin compounds are preferable from the standpoint of exposure sensitivity.

The photopolymerization initiator includes more preferably triazine compounds, alkylamino compounds, α-aminoketone compounds, acylphosphine compounds, phosphine oxide compounds, oxime compounds, biimidazole compounds, onium compounds, benzophenone compounds and acetophenone compounds, and at least one compound selected from the group consisting of triazine compounds, alkylamino compounds, oxime compounds and biimidazole compounds is further preferable, and most preferable are oxime compounds and biimidazole compounds.

Particularly, the pigment concentration of the black resist composition is high in its formulation for obtaining a sufficient light shielding property, in contrast, the addition amount of the initiator becomes small, to lower sensitivity. When initiators generating a halogen-containing compound in exposure such as triazine compounds and the like are used in performing exposure by a stepper, corrosion of an apparatus occurs, thus, such initiators cannot be used. In view of such reasons, oxime compounds are preferable, and particularly, oxime compounds showing absorption at 365 nm are most preferable, as the photopolymerization initiator satisfying sensitivity and various properties.

The content of the photopolymerization initiator is preferably 0.1 wt % to 50 wt %, more preferably 0.5 wt % to 30 wt %, particularly preferably 1 wt % to 20 wt %, with respect to the total solid content of the black resist composition. In this range, excellent sensitivity and pattern formability are obtained.

(Compound Containing Ethylenically Unsaturated Double Bond)

The black resist composition of the present invention can contain a compound containing an ethylenically unsaturated double bond (hereinafter, referred to simply as "polymerizable compound" in some cases) other than the above-described resins.

The compound containing an ethylenically unsaturated double bond is an addition-polymerizable compound having at least one ethylenically unsaturated double bond, other than the above-described resins, and selected from compounds containing at least one end ethylenically unsaturated bond, preferably containing two or more end ethylenically unsaturated bonds. Such compounds are known widely in the art, and these compounds can be used without limitation in the present invention. These compounds have a chemical form such as, for example, a monomer, a prepolymer, that is, a dimer, a trimer and an oligomer, or a mixture thereof, and a copolymer thereof or the like.

Examples of the polymerizable compound which can be suitably used in the present invention include compounds described in JP-A No. 2008-233244, paragraph numbers [0115] to [0116] and compounds described in JP-A No. 2009-20453, paragraph numbers [0100] to [0109], and these compounds can be used according to the object.

As the polymerizable compound which can be used in the present invention, preferable are bisphenol A diacrylate EO-modified body, pentaerythritol triacrylate, pentaerythritol tetraacrylate, dipentaerythritol pentaacrylate, dipentaerythritol pentaacrylate succinic acid-modified body, dipentaerythritol hexaacrylate, tri(acryloyloxyethyl) isocyanurate, pentaerythritol tetraacrylate EO-modified body, dipentaerythritol hexaacrylate EO-modified body and the like, and as commercial products, DPI-IA-40H (manufactured by Nippon Kayaku Co., Ltd.), UA-306H, UA-306T, UA-306I, AH-600, T-600, AI-600 (manufactured by Kyoei K.K.) are preferable.

The content of the compound containing an ethylenically unsaturated double bond is preferably 1 wt % to 90 wt %, more preferably 5 wt % to 80 wt %, further preferably 10 wt % to 70 wt % in the solid content of the black resist composition.

It is preferable that the black resist composition contains further an alkali-soluble resin. By inclusion of an alkali-soluble resin, developability and pattern formability are improved.

[Alkali-Soluble Resin]

The alkali-soluble resin is a linear organic high molecular weight polymer, and can be appropriately selected from alkali-soluble resins having at least one group promoting alkali solubility (for example, a carboxyl group, a phosphoric group, a sulfonic group, a hydroxyl group and the like) in a molecule (preferably, a molecule containing an acrylic copolymer or a styrene copolymer as the main chain).

Examples of the above-described alkali-soluble resin include resins described in JP-A No. 2008-233244, paragraph numbers [0096] to [0111].

As specific constituent units of the alkali-soluble resin, particularly, copolymers composed of (meth)acrylic acid and other copolymerizable monomer, that is, acrylic resins are suitable.

Of them, benzyl (meth)acrylate/(meth)acrylic acid copolymers and multicomponent copolymers composed of benzyl (meth)acrylate/(meth)acrylic acid/other monomer are particularly suitable.

It is preferable that the acrylic resin has an acid value in the range of 20 mg KOH/g to 200 mg KOH/g. In this range, developability and pattern formability are excellent.

The weight-average molecular weight Mw (polystyrene-reduced value measured by a GPC method) of the acrylic resin is preferably 2000 to 100000, more preferably 3000 to 50000, for realizing a viscosity range for easy coating of a color resist and the like and for ensuring film strength.

The above-specified range of the acid value of the acrylic resin can be easily obtained by appropriately adjusting copolymerization ratios of monomers. The above-described range of the weight-average molecular weight can be easily obtained by using a suitable amount of a chain transfer agent according to the polymerization method in copolymerization of monomers.

The acrylic resin can be produced, for example, by a radical polymerization method known per se. Polymerization conditions such as the temperature and the pressure in producing an acrylic resin by a radical polymerization method, the kind and the amount of a radical initiator, the kind of a solvent and the like can be easily set by those skilled in the art, and condition setting thereof is possible.

The addition amount in adding an alkali-soluble resin to the black resist composition is preferably 5 wt % to 90 wt %, more preferably 10 wt % to 60 wt % with respect to the total solid content of the composition. In this range, film strength is high, a membrane property is excellent, and image formability is excellent.

For improving the cross-linkage efficiency of the black resist composition in the present invention, alkali-soluble resins having a polymerizable group may be used singly or may be used together with an alkali-soluble resin having no polymerizable group, and polymers containing an aryl group, a (meth)acryl group, an aryloxyalkyl group or the like in the side chain are useful.

An alkali-soluble resin having a polymerizable double bond can be developed with an alkali developing liquid, and further have a photo-curing property and a thermosetting property.

Examples of these polymers having a polymerizable group include, but not limited to, the following resins providing an alkali-soluble group such as a COOH group, an OH group and the like and a carbon-carbon unsaturated bond are contained.

(1) Urethane-modified polymerizable double bond-containing acrylic resins obtained by previously reacting an isocyanate group with an OH group, and reacting a compound having one unreacted isocyanate group and containing at least one (meth)acryloyl group with an acrylic resin containing a carboxyl group.

(2) Unsaturated group-containing acrylic resins obtained, by reacting an acrylic resin containing a carboxyl group with a compound having an epoxy group and a polymerizable double bond in the molecule.

(3) Acid-pendant epoxy acrylate resins.

(4) Polymerizable double bond-containing acrylic resins obtained by reacting an acrylic resin containing an OH group with a dibasic acid anhydride having a polymerizable double bond.

Of the above-described examples, the resins (1) and (2) are preferable.

The acid value of alkali-soluble resin having a polymerizable double bond is preferably 30 mg KOH/g to 150 mg KOH/g, more preferably 35 mg KOH/g to 120 mg KOH/g, and the weight-average molecular weight Mw is preferably 2000 to 50000, more preferably 3000 to 30000.

Examples of commercial products of the alkali-soluble resin include Dianal NR series (manufactured by Mitsubishi Rayon Co., Ltd.); Photomer 6173 (COOH group-containing polyurethane acrylic oligomer, manufactured by Diamond Shamrock Co., Ltd.); Viscoat R-264, KS resist 106 (all are manufactured by Osaka Organic Chemical Industry Ltd.); Cyclomer P series, Placcel $CF_{200}$ series (all are manufactured by Daicel Chemical Industries, Ltd.); Ebecryl 3800 (manufactured by Daicel-UCB company Ltd.), and the like.

[Organic Solvent]

The black resist composition in the present invention can be constituted, in general, using an organic solvent. The organic solvent is basically not particularly restricted providing that the solubility of components and the coatability of the black resist composition are satisfied, and it is preferable that the organic solvent is selected in view of particularly the solubility, the coatability and the safety of an ultraviolet absorber and a binder. In preparing the black resist composition in the present invention, at least two organic solvents are preferably contained.

The organic solvent suitably includes esters: for example, ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetates (e.g.: methyl oxyacetate, ethyl oxyacetate, butyl oxyacetate (for example, methyl methoxyacetate, ethyl methoxyacetate, butyl methoxyacetate, methyl ethoxyacetate, ethyl ethoxyacetate and the like)), alkyl 3-oxypropionates (e.g.: methyl 3-oxypropionate, ethyl 3-oxypropionate and the like (for example, methyl 3-methoxypropionate, ethyl 3-methoxypropionate, methyl 3-ethoxypropionate, ethyl 3-ethoxypropionate and the like)), alkyl 2-oxypropionates (e.g.: methyl 2-oxypropionate, ethyl 2-oxypropionate, propyl 2-oxypropionate and the like (for example, methyl 2-methoxypropionate, ethyl 2-methoxypropionate, propyl 2-methoxypropionate, methyl 2-ethoxypropionate, ethyl 2-ethoxypropionate)), methyl 2-oxy-2-methylpropionate and ethyl 2-oxy-2-methylpropionate (for example, methyl 2-methoxy-2-methylpropionate, ethyl 2-ethoxy-2-methylpropionate and the like), methyl pyruvate, ethyl pyruvate, propyl pyruvate, methyl acetoacetate, ethyl acetoacetate, methyl 2-oxobutanoate, ethyl 2-oxobutanoate and the like, ethers: for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate and the like, ketones: for example, methyl ethyl ketone, cyclohexanone, 2-heptanone, 3-heptanone and the like, and aromatic hydrocarbons, for example, toluene, xylene and the like.

It is also preferable that two or more of these organic solvents are mixed, from the standpoint of the solubility of an ultraviolet absorber and an alkali-soluble resin, improvement in a coated surface state, and the like. In this case, particularly preferable are mixed solutions constituted of two or more compounds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether and propylene glycol methyl ether acetate.

Regarding the content of the organic solvent in the colored curing composition, the total solid concentration of the composition is preferably 5 to 80 wt %, further preferably 5 to 60 wt %, particularly preferably 10 to 50 wt % from the standpoint of coatability.

The black resist composition may further contain components described in detail below if necessary.

[Sensitizer]

The black resist composition may contain a sensitizer for the purpose of improving the radical generation efficiency of a polymerization initiator and elongating the photosensitization wavelength. As the sensitizer which can be used in the present invention, those sensitizing the above-described photopolymerization initiator by an electron transfer mechanism or an energy transfer mechanism are preferable. The sensitizer which can be used in the present invention includes those belonging to compounds listed below and having an absorption wavelength in the range of 300 nm to 450 nm.

Preferable examples of the sensitizer include those belonging to the following compounds and having an absorption wavelength in the range of 330 nm to 450 nm.

Examples thereof include polycyclic aromatics (for example, phenanthrene, anthracene, pyrene, perylene, triphenylene, 9,10-dialkoxyanthracene), xanthenes (for example, fluorescein, eosin, erythrosine, rhodamine B, rose bengal), thioxanthones (isopropylthioxanthone, diethylthioxanthone, chlorothioxanthone), cyanines (for example, thiacarbocyanine, oxacarbocyanine), merocyanines (for example, merocyanine, carbomerocyanine), phthalocyanines, thiazines (for example, thionine, methylene blue, toluidine blue), acridines (for example, acridine orange, chloroflavin, acriflavine), anthraquinones (for example, anthraquinone), squaliums (for example, squalium), acridine orange, coumarins (for example, 7-diethylamino-4-methyl coumarin), ketocoumarin, phenothiazines, phenazines, styrylbenzenes, azo compounds, diphenylmethane, tiphenylmethane, distyrylbenzenes, carbazoles, porphyrin, Spiro compounds, quinacridone, indigo, styryl, pyrylium compounds, pyromethene compounds, pyrazolotriazole compounds, benzothiazole compounds, barbituric acid derivatives, thiobarbituric acid derivatives, acetophenone, benzophenone, thioxanthone, Michler's ketone and the like (aromatic ketone compounds), N-aryloxazolidinone and the like (heterocyclic compounds), and the like.

Further, compounds described in EU Patent No. 568,993, U.S. Pat. Nos. 4,508,811 and 5,227,227, JP-A No. 2001-125255, JP-A No. 11-271969 and the like, etc. are listed.

[Polymerization Inhibitor]

It is desirable to add a small amount of a thermal polymerization preventing agent for inhibiting unnecessary thermal polymerization of a compound having a polymerizable ethylenically unsaturated double bond during production or during storage of the black resist composition.

The thermal polymerization preventing agent includes hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxyamine primary cerium salt, and the like.

The addition amount of the polymerization inhibitor is preferably about 0.01 wt % to about 5 wt % with respect to the weight of the whole composition. If necessary, a higher fatty acid derivative such as behenic acid and behenic amide and the like may be added to be eccentrically located on the surface of a photosensitive layer in a process of drying after coating, for preventing polymerization inhibition by oxygen. The addition amount of the higher fatty acid derivative is preferably about 0.5 wt % to about 10 wt % based on the whole composition.

[Surfactant]

To the black resist composition, various surfactants may be added from the standpoint of further improving coatability. As the surfactant, use can be made of various surfactants such as fluorine-based surfactants, nonionic surfactants, cationic surfactants, anionic surfactants, silicone surfactants and the like.

Particularly when the black resist composition contains a fluorine-based surfactant, the liquid property (particularly, flowability) when a coating liquid is prepared is further improved, thus, the uniformity of coated thickness and liquid saving can be further improved.

That is, in the case of forming a film using a coating liquid prepared by using a black resist composition containing a fluorine-based surfactant, the surface tension between a coating surface and a coating liquid is lowered, thereby enhancing wettability to the coating surface and improving coatability on the coating surface. This is effective in that a film having uniform thickness of small irregularity can be suitably formed even in the case of formation of a thin film of about several μm with a small amount of liquid.

The fluorine content in the fluorine-based surfactant is suitably 3 wt % to 40 wt %, more preferably 5 wt % to 30 wt %, particularly preferably 7 wt % to 25 wt %. The fluorine-based surfactant having a fluorine content in this range is effective in uniformity of the thickness of a coated film and in liquid saving, and also shows excellent solubility in the black resist composition.

Examples of the fluorine-based surfactant include Megafac F171, F172, F173, F176, F177, F141, F142, F143, F144, R30, F437, 475, F479, F482, F554, F780 and F781 (all are manufactured by DIC Corporation), Fluorad FC430, FC431 and FC171 (all are manufactured by Sumitomo 3M Limited), Surflon S-382, SC-101, SC-103, SC-104, SC-105, SC1068, SC-381, SC-383, 5393 and KH-40 (all are manufactured by Asahi Glass Co., Ltd.), Solsperse 20000 (The Lubrizole Corporation), and the like.

Specific examples of the nonionic surfactant include glycerol, trimethylolpropane, trimethylolethane and ethoxylates and propoxylates thereof (for example, glycerol propoxylate, glycerin ethoxylate and the like), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty esters (Pluronic L10, L31, L61, L62, 10R5, 17R2 and 25R2, Tetronic 304, 701, 704, 901, 904 and 150R1 manufactured by BASF), and the like.

Specific examples of the cationic surfactant include phthalocyanine derivatives (trade name: EFKA-745, manufactured by Morishita & Co., Ltd.), organosiloxane polymer KP341 (manufactured by Shin-Etsu Chemical Co., Ltd.), (meth) acrylic acid (co)polymer Polyflow No. 75, No. 90 and No. 95 (manufactured by Kyoeisha Chemical Co., Ltd.), WO01 (manufactured by Yusho Co., Ltd.) and the like.

Specific examples of the anionic surfactant include WO04, WO05 and WO17 (manufactured by Yusho Co., Ltd.), and the like.

Examples of the silicone surfactant include "Toraysilicone DC3PA", "Toraysilicone SH7PA", "Toraysilicone DC11PA", "Toraysilicone SH21PA", "Toraysilicone SH28PA", "Toraysilicone SI 129PA", "Toraysilicone SH30PA" and "Toraysilicone SH8400" manufactured by Dow Corning Toray Co., Ltd., "TSF-4440", "TSF-4300", "TSF-4445", "TSF-4460" and "TSF-4452" manufactured by Momentive Performance Materials Inc., "KP341", "KF6001" and "KF6002" manufactured by Shin-Etsu Chemical Co., Ltd., "BYK307", "BYK323" and "BYK330" manufactured by BYK, and the like. The surfactants may be used singly or in combination of two or more of them.

The addition amount of the surfactant is preferably 0.001 wt % to 20 wt %, more preferably 0.005 wt % to 1.0 wt % with respect to the total weight of the black resist composition.

[Other Additives]

Further, inorganic fillers, plasticizers, and support close adhesion agents capable of improving close adhesion to a support may be added for improving the physical properties of a cured membrane.

Examples of the plasticizer include dioctyl phthalate, didodecyl phthalate, triethylene glycol dicaprylate, dimethyl glycol phthalate, tricresyl phosphate, dioctyl adipate, dibutyl sebacate, triacetylglycerin and the like, and in the case of use of a binder, it can be added in an amount of 10 wt % or less with respect to the total weight of the binder and a compound having an ethylenically unsaturated double bond.

When the black resist composition is applied to the surface a cured material such as a support and the like, additives for improving the close adhesion with the surface of the cured material (hereinafter, referred to as "support close adhesion agent") may be added.

As the support close adhesion agent, known materials can be used, and it is particularly preferable to use silane coupling agents, titanate coupling agents and aluminum coupling agents.

As the silane coupling agent, for example, γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, aminopropyltriethoxysilane and phenyltrimethoxysilane are preferable, and γ-methacryloxypropyltrimethoxysilane is most preferable.

The content of the support close adhesion agent is preferably 0.1 wt % or more and 30 wt % or less, more preferably 0.5 wt % or more and 20 wt % or less, particularly preferably 1 wt % or more and 10 wt % or less, with respect to the total solid content of the black resist composition of the present invention, from the standpoint of no residue of the black resist composition on an unexposed part.

In the wafer level lens, the light reflection rate of the black resist layer 14 is lower as compared with a layer composed of a metal or the like. Because of this reason, defects such as ghosts, flares and the like due to a reflected light can be reduced while sufficiently shielding a light by the black resist layer 14. For example, the above-described effect can be obtained when the reflection rate is 2% or less and the transmittance is 1% or less for a visible light having a wavelength of 400 to 700 nm. The black resist layer 14 having such a property can be formed by using the above-described black resist composition.

The reflection rate in the present invention can be measured by using a spectrophotometer for the composition coated on a desired substrate. The reflected light of a visible light (400-700 nm) is measured. Lower reflection lights are preferable, and the average thereof is 2% or less, preferably, the reflection rate is 1.5% or less.

Next, preferable examples of the procedure for producing the above-described wafer level lens will be explained. In embodiments to be explained below, explanations of members having the same constitution and action with those of the members already explained above are simplified or omitted by attaching the same marks or correspondent marks in a figure.

Figure 5:
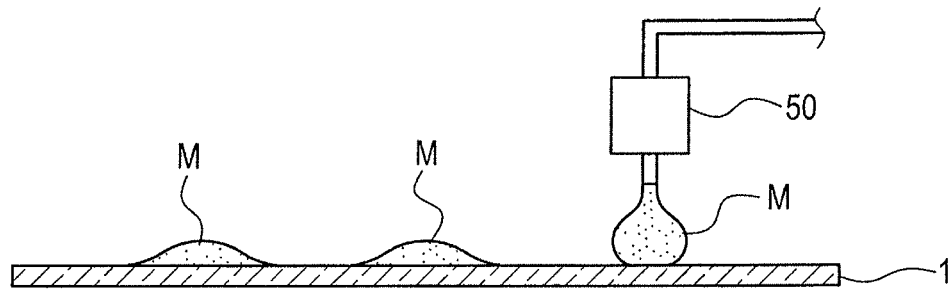
FIG. 5 is a view showing the condition of feeding a molding material to be a lens on a substrate.
Figure 6A:
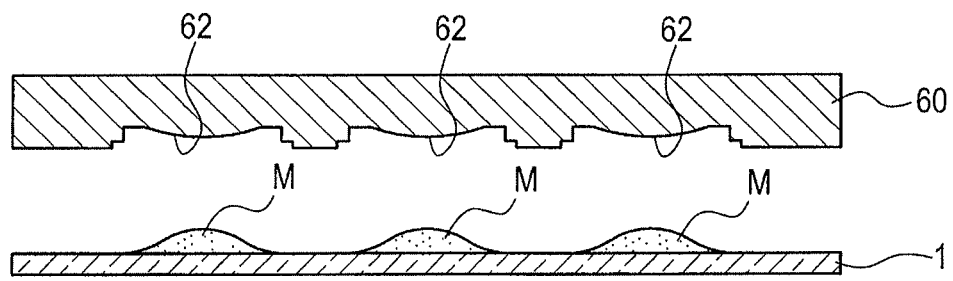
FIG. 6A to FIG. 6C are views showing a procedure of molding lenses on a substrate with a mold.
Figure 6B:
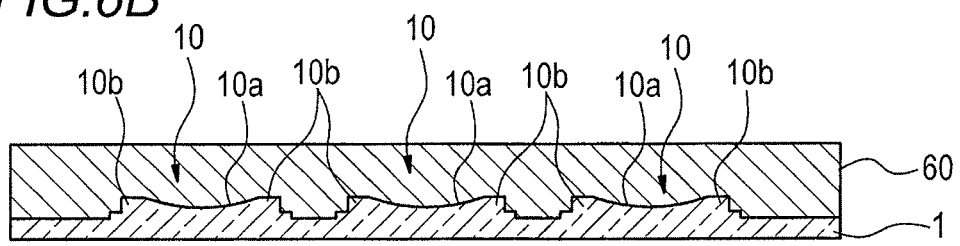
Figure 6C:
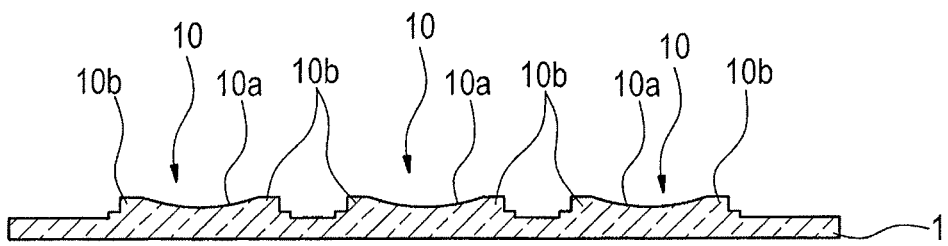

FIG. 5 is a view showing the condition of feeding a molding material to be a lens on a substrate. FIG. 6A to FIG. 6C are views showing a procedure of molding lenses on a substrate with a mold.

As the material for forming the lens 10, for example, glass can be used. Glass is suitable as a material of a lens needing large power since there are a lot of glass materials and those having a high refractive index can be selected. Further, glass is excellent in heat resistance, and is suitable for reflow mounting of the above-described imaging unit.

As the material for forming the lens 10, resins can also be used. Resins are excellent in processability, and are suitable for forming a lens surface with a mold simply and at low cost. As the resin, any one of ultraviolet curable resins, thermosetting resins and thermoplastic resins can be used, and when reflow mounting of the above-described image unit is taken into consideration, those having a relatively high softening point of 200° C. or higher are preferable, and those of 250° C. or higher are more preferable.

As the ultraviolet curable resin, exemplified are ultraviolet curable silicon resins, ultraviolet curable epoxy resins, acrylic resins and the like. As the epoxy resin, those having a linear expansion coefficient of 40 to 80 [$10^{-6}$/K] and a refractive index of 1.50 to 1.70, preferably 1.50 to 1.65 can be used. As the thermosetting resin, exemplified are thermosetting silicon resins, thermosetting epoxy resins, thermosetting phenol resins, thermosetting acrylic resins and the like. For example, as the silicon resin, those having a linear expansion coefficient of 30 to 160 [$10^{-6}$/K] and a refractive index of 1.40 to 1.55 can be used. The epoxy resins having a linear expansion coefficient of 40 to 80 [$10^{-6}$/K] and a refractive index of 1.50 to 1.70, preferably 1.50 to 1.65 can be used. The phenol resins having a linear expansion coefficient of 30 to 70 [$10^{-6}$/K] and a refractive index of 1.50 to 1.70 can be used. The acrylic resins having a linear expansion coefficient of 20 to 60 [$10^{-6}$/K] and a refractive index of 1.40 to 1.60, preferably 1.50 to 1.60 can be used. As the thermosetting resin, specifically exemplified are SMX-7852 and SMX-7877 manufactured by Fuji Polymer Industries Co., Ltd., NSM-4500 manufactured by Toshiba Corporation, SR-7010 manufactured by Dow Corning Toray Co., Ltd., and the like. As the thermoplastic resin, exemplified are polycarbonate resins, polysulfone resins, polyether sulfone resins and the like. The polycarboantes having a linear expansion coefficient of 60 to 70 [$10^{-6}$/K] and a refractive index of 1.40-1.70, preferably 1.50 to 1.65 can be used. The polysulfone resins having a linear expansion coefficient of 15 to 60 [$10^{-6}$/K] and a refractive index of 1.63 can be used. The polyether sulfone resins having a linear expansion coefficient of 20 to 60 [$10^{-6}$/K] and a refractive index of 1.65 can be used.

In general, optical glass has a linear expansion coefficient at 20° C. of 4.9 to 14.3 [$10^{-6}$/K] and a refractive index of 1.4 to 2.1 at a wavelength of 589.3 nm. Quartz glass has a linear expansion coefficient of 0.1 to 0.5 [$10^{-6}$/K] and a refractive index of about 1.45.

Further, it is preferable to use an organic inorganic composite material obtained by dispersing inorganic fine particles in a resin matrix. Examples of the inorganic fine particles include oxides fine particles, sulfides fine particles, selenide fine particles and telluride fine particles. More specifically, fine particles of, for example, zirconium oxide, titanium oxide, zinc oxide, tin oxide, zinc sulfide and the like are mentioned.

The inorganic fine particles may be used singly or in combination of two or more of them. A composite composed of several components may also be used. Further, the inorganic fine particles may be doped with a dissimilar metal, the surface layer thereof may be covered with a dissimilar metal oxide such as silica, alumina and the like, or the surface thereof may be modified with a silane coupling agent, a titanate coupling agent, an organic acid (carboxylic acids, sulfonic acids, phosphoric acids, phosphonic acids and the like) or a dispersing agent having an organic acid group, or the like, for the purpose of reducing photocatalytic activity, reducing water absorption coefficient, and the like.

When the number average particle size of the inorganic fine particles is too small, the properties of the substance may change in some cases. When a difference in refractive index between the resin matrix and the inorganic fine particles is large, an influence by Rayleigh scattering becomes remarkable if the number average particle size of the inorganic fine particles is too large. Because of this reason, it is preferably 1 nm to 15 nm, further preferably 2 nm to 10 nm, particularly preferably 3 nm to 7 nm. It is desirable that the inorganic fine particles have narrower particle size distribution. Though the definition methods of such monodispersed particles are various, for example, the numerical value prescription range as described in JP-A No. 2006-160992 is a preferable particle size distribution range. The above-described number-average primary particle size can be measured, for example, by an X-ray diffraction (XRD) instrument, a transmission electron microscope (TEM) and the like.

The refractive index of the inorganic fine particles is preferably 1.90 to 3.00, further preferably 1.90 to 2.70, particularly preferably 2.00 to 2.70 at a temperature of 22° C. and a wavelength of 589.3 nm.

The content of the inorganic fine particles in the resin is preferably 5 wt % or more, further preferably 10 to 70 wt %, particularly preferably 30 to 60 wt %, from the standpoint of transparency and enhanced refractive index.

As the resin used in the organic inorganic composite material, known ultraviolet curable resins, thermosetting resins and thermoplastic resins can be used. Further mentioned are resins having a refractive index of larger than 1.60 described in JP-A No. 2007-93893, block copolymers constituted of a hydrophobic segment and a hydrophilic segment described in JP-A No. 2007-211164, resins having a functional group which is capable of forming any chemical bond to the inorganic fine particles at the polymer end or side chain described in JP-A No. 2007-238929, Japanese Patent Application No. 2008-12645, JP-A No. 2010-043191, JP-A No. 2010-065063 and JP-A No. 2010-54817, thermoplastic resins described in JP-A No. 2010-031186 and JP-A No. 2010-37368, and the like. To the organic inorganic composite material, additives such as plasticizers, dispersing agents and the like can be added if necessary.

As the material of the substrate 1, the same molding material as that of the lens 10 can be used. The substrate 1 may also be fabricated by using a different material from the molding material of the lens 10 providing that it is a material transparent to a visible light such as glass and the like. In this case, it is preferable that that the linear expansion coefficient of the material forming the substrate 1 is close to the linear expansion coefficient of the material forming the lens 10. When the linear expansion coefficient of the material forming the lens 10 is closed to the linear expansion coefficient of the material forming the substrate 1, disadvantages such as distortion and cracking of the lens 10 can be avoided in reflow mounting of the above-described imaging unit 1.

An infrared filter (IR filter) may be formed on the surface of the light incident side of the substrate 1 (not shown).

As shown in FIG. 5, a molding material M is dropped by using a dispenser 50 on a part of molding of a lens of the substrate 1. Here, a molding material M in an amount corresponding to one lens 10 is fed to one feeding part.

After feeding the molding material M on the substrate 1, a mold 60 for molding a lens is placed as shown in FIG. 6A. On the mold 60, concave portions 62 for transferring the shape of the lens 10 are provided corresponding to the number of desired lenses 10.

As shown in FIG. 6B, the mold 60 is pushed to the molding material M on the substrate 1, thereby deforming the molding material M to correspond to the shape of the concave portion. Under the condition of pushing the mold 60 to molding material M, heat or ultraviolet ray is irradiated from the outside of the mold to cure the molding resin M when the molding resin M is a thermosetting resin or an ultraviolet curable resin.

After curing of the molding material M, the substrate 1 and the lenses 10 are released from the mold 60 as shown in FIG. 6C.

Figure 7A:
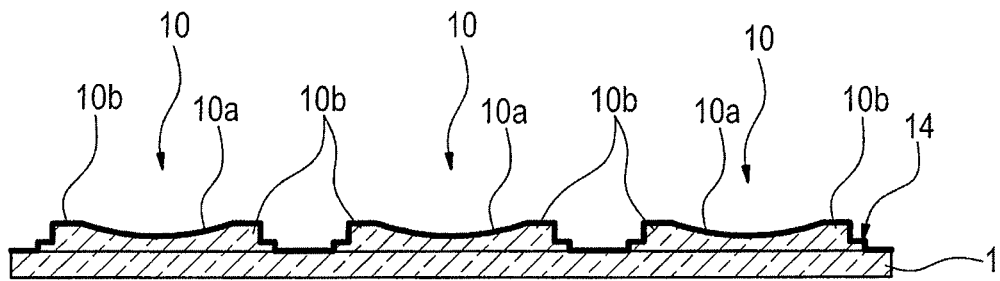
FIG. 7A to FIG. 7C are views explaining a procedure of patterning a black resist layer on a substrate carrying thereon molded lenses.
Figure 7B:
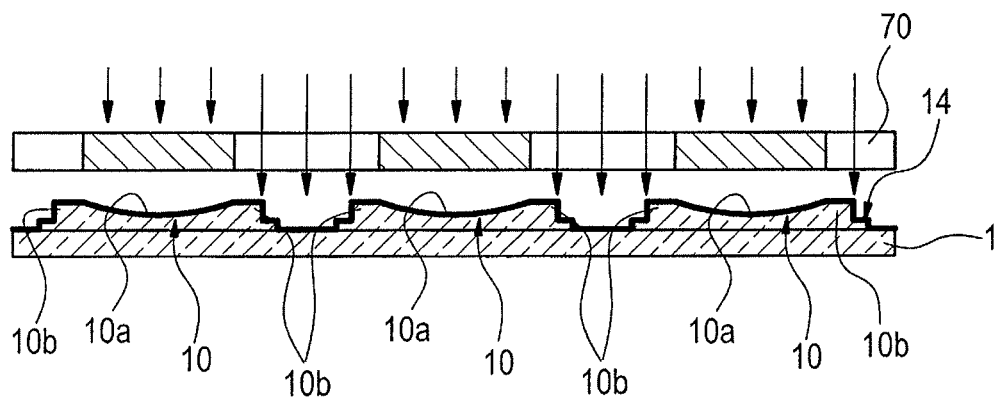
Figure 7C:
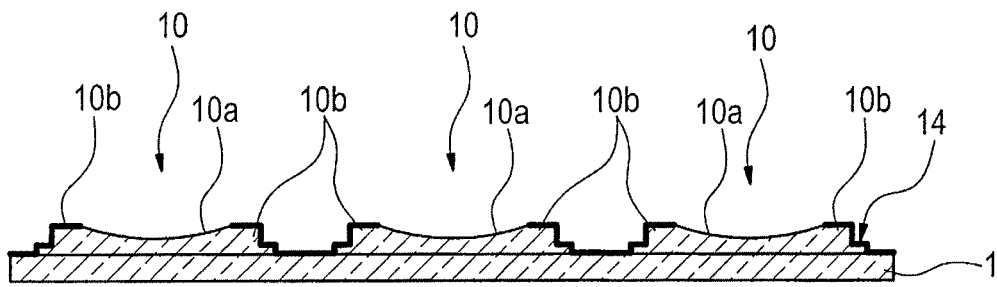

FIG. 7A to FIG. 7C are views explaining a procedure of patterning the black resist layer on the substrate carrying thereon molded lenses.

[Pattern Formation Method]

Next, the pattern formation method will be explained.

The pattern formation method of the black resist layer contains a black resist layer forming step of coating a black resist composition on a substrate to form a black resist layer composed of the resist composition, an exposing step of exposing this black resist layer via a mask, and a developing step of developing the black resist layer after exposure to form a light shielding pattern. The pattern formation may be arbitrarily carried out before fabrication of a lens or after fabrication of a lens.

The steps in the production method of the present invention will be explained below.

<Black Resist Layer Forming Step>

In the black resist layer forming step, a black resist composition is coated on the surface of the lens module having the substrate 1 on which a plurality of lenses 10 have been formed, thereby forming a black resist layer 14 of low light reflection rate composed of the resist composition. In this case, the black resist layer 14 is formed to cover all of the surface of the substrate part, and the lens surface 10a of the lens 10 and the lens marginal part 10b, on the surface of the lens module.

The substrate 1 used in this step is not particularly restricted. Examples thereof include soda glass, Pyrex (registered trademark) glass, quartz glass and transparent resins, and the like.

On the substrate 1, a primer layer may be provided if necessary, for improvement of close adhesion to the upper layer, prevention of substance scattering, or flattening of the surface of the substrate 1.

For coating the black resist composition, various coating methods can be used such as slit coating, spray coating, inkjet, rotation coating, cast coating, roll coating, screen printing and the like. For obtaining excellent film thickness, spray coating is preferable. Spray coating is preferable also for obtaining low reflection rate.

As preferable conditions for spray-coating the black resist composition, a composition having a solid content of 10% to 40% is used, coated at a rate of 0.01 cc to 10 ccc per minute, and coated with a distance of 1 cm to 30 cm from the substrate 1. The diameter of a nozzle for spray coating is preferably 0.05 mm to 1 mm.

The thickness of the black resist composition directly after coating is preferably 0.1 µm to 20 µm, further preferably 0.1 µm to 10 µm, more preferably 0.2 µm to 10 µm, particularly preferably 0.2 µm to 5 µm, most preferably 0.2 µm to 3 µm, from the standpoint of thickness uniformity of the coated film and easiness of drying of the coating solvent.

In the case of use of a spray coating method, the thickness of the black resist composition and uniformity of the black resist layer can be adjusted by appropriately controlling the spray pressure condition, the discharge amount of the black resist composition, the kind of the spray nozzle, the distance between the lens substrate and the spray nozzle, and the like. The spray coating apparatus which can be used in the present invention includes Nanospray manufactured by EVG, AltaSpray manufactured by SUSS, Resist Spray Coater RS-C810A manufactured by TechinTech Co., Ltd., TS-MSP-400, TS-MSP-300, TS-MSP-200 and TS-MSP-100 manufactured by TAITECH Corporation, USC-2000ST manufactured by USHIO Inc., and the like.

Drying (prebake) of the coated black resist layer 14 (resist composition layer) can be carried out by a hot plate, an oven and the like at a temperature of 50° C. to 140° C. for 10 seconds to 300 seconds.

The coated thickness after drying of the black resist composition (hereinafter, referred appropriately to as "dried film thickness") can be arbitrarily selected based on desired performances such as a light shielding property and the like, and, in general, in the range of 0.1 µm or more and less than 50 µm.

<Exposing Step>

In the exposing step, the black resist layer 14 (resist composition layer) formed in the above-described black resist layer forming step is exposed in the form of pattern using photolithography. Though the pattern exposure may be scanning exposure, an embodiment of carrying out exposure via a mask 70 having a prescribed mask pattern as shown in FIG. 7B is preferable.

In exposure of this step, the black resist layer 14 is pattern-exposed via a prescribed mask pattern, and only parts of the black resist layer 14 irradiated with a light are cured. Here, a mask pattern allowing irradiation with a light on the surface of the lens marginal part 10b and the surface of the substrate 1 between the lenses 10 is used. By this, only regions of the black resist layer 14 excluding the lens surface 10a are cured by light irradiation. As radiations which can be used in exposure, particularly, ultraviolet rays such as g line, h line, i line and the like are preferably used. For this radiation, a light source of single wavelength may be used, or a light source including all wavelengths such as a high pressure mercury lamp may be used.

<Developing Step>

Then, by carrying out an alkali developing treatment (developing step), parts of no irradiation by the above-described exposure are dissolved in an alkali aqueous solution, leaving only photo-cured parts. In this example, only the black resist layer 14 formed on the lens surface 10a is removed, and the black resist layer 14 remains on other regions (see, FIG. 7C). As the alkali agent, organic or inorganic alkali agents and combinations thereof can be used. In the present invention, organic alkali developing liquids causing no damages on surrounding circuits and the like are desirable.

Examples of the alkali agent used in the developing liquid include organic alkaline compounds such as ammonia water, ethylamine, diethylamine, dimethylethanolamine, tetramethylammonium hydroxide, tetraethylammonium hydroxide, choline, pyrrole, piperidine, 1,8-diazabicyclo-[5.4.0]-7-undecene and the like, inorganic compounds such as sodium hydroxide, potassium hydroxide, sodium hydrogen carbonate, potassium hydrogen carbonate and the like, and alkaline aqueous solutions prepared by diluting these alkali agents with pure water so as to give a concentration of 0.001 wt % to 10 wt %, preferably 0.01 wt % to 1 wt % can be preferably used as the developing liquid. It is also possible to add alcohols and surfactants in suitable amount to the above-described alkaline aqueous solution.

In the case of use of a developing liquid composed of such an alkaline aqueous solution, washing with pure water (rinse) is generally performed after development.

As the developing method, for example, a method (dip method) of immersing a substrate for a certain time in a bath filled with a developing liquid, a method (paddle method) of lifting a developing liquid on the surface of a substrate by surface tension and allowing it to stand still for a certain time, thereby attaining development, a method (spray method) of spraying a developing liquid on the surface of a substrate, a method (dynamic dispense method) of continuously discharging a developing liquid on a substrate rotating at constant speed while scanning a developing liquid discharge nozzle at constant speed, and the like, can be applied.

The developing temperature is usually 20° C. to 30° C. and the developing time is in the range of 20 seconds to 90 seconds.

Then, an excess developing liquid is removed by washing, and drying is carried out.

After carrying out the above-described black resist layer forming step, exposing step and developing step in the production method of this example, a curing step of curing the formed shielding pattern by heating (post bake) and/or exposure may also be contained, if necessary.

Post bake is a heating treatment after development for completing curing, and usually, a thermal curing treatment at 100° C. to 250° C. is carried out. Conditions such as the temperature of post bake and the time thereof can be appropriately set by selecting the material of the substrate or the lens. For example, when the substrate is made of glass, temperatures of 180° C. to 240° C. are suitably used among the above-described temperature range.

This post bake treatment can be carried out in continuous mode or batch mode on the black resist layer 14 after development by using a heating means such as a hot plate, a convection oven (hot air circulation mode drier), a high frequency wave heating machine and the like so as to obtain the above-described conditions.

The energy-curable resin composition used in the wafer level lens may be any of resin compositions cured by heat or resin compositions cured by irradiation with an active energy ray (for example, ultraviolet ray, electron beam).

It is preferable that the material has suitable flowability before curing from the standpoint of molding properties such as transfer suitability of a mold shape and the like. Specifically, those which are liquid and having a viscosity of about 1000 to 50000 mPa·s at ambient temperature are preferable.

It is preferable that the material has heat resistance after curing with which thermal deformation does not occur even through a reflow process. From this standpoint, the glass transition temperature after curing is preferably 200° C. or higher, more preferably 250° C. or higher, particularly preferably 300° C. or higher. For imparting such high heat resistance to the resin composition, the mobility at molecule level should be suppressed, and effective methods thereof include (1) a method of enhancing cross-linkage density per unit volume, (2) a method of utilizing a resin having a rigid cyclic structure (for example, alicyclic structures such as cyclohexane, norbornane, tetracyclododecane and the like, aromatic cyclic structures such as benzene, naphthalene and the like, curd structures such as 9,9'-biphenylfluorene and the like, resins having a spiro structure such as spirobiindane and the like, specifically, resins described in, for example, JP-A Nos. 9-137043 and 10-67970, JP-A Nos. 2003-55316, 2007-334018 and 2007-238883, and the like), (3) a method of uniformly dispersing a substance of high Tg such as inorganic fine particles and the like (described in, for example, JP-A Nos. 5-209027 and 10-298265, and the like), and the like. These methods may be combined, and preferably controlled in a range not deteriorating other properties such as flowability, shrinkage ratio, refractive index property and the like.

Resin compositions showing small volume shrinkage rate by a curing reaction are preferable from the standpoint of shape transfer precision. The curing shrinkage ratio of the resin composition used in the present invention is preferably 10% or less, more preferably 5% or less, particularly preferably 3% or less.

Examples of the resin composition showing a low cure shrinkage ratio include (1) resin compositions containing a high molecular weight curing agent (prepolymer and the like) (described in, for example, JP-A Nos. 2001-19740, 2004-302293 and 2007-211247, and the like, the number average molecular weight of the high molecular weight curing agent is in the range of preferably 200 to 100000, more preferably 500 to 50000, particularly preferably 1000 to 20000. The value calculated by dividing the number average molecular weight of the curing agent by the number of cure reactive groups is in the range of preferably 50 to 10000, more preferably 100 to 5000, particularly preferably 200 to 3000.), (2) resin compositions containing a nonreactive substance (organic/inorganic fine particle, nonreactive resin and the like) (described in, for example, JP-A Nos. 6-298883, 2001-247793 and 2006-225434, and the like), (3) resin compositions containing a low shrinkage crosslink-reactive group (for example, ring-opening polymerizable groups (for example, epoxy groups (described in, for example, JP-A No. 2004-210932 and the like), oxetanyl groups (described in, for example, JP-A No. 8-134405 and the like), episulfide groups (described in, for example, JP-A No. 2002-105110 and the like), cyclic carbonate groups (described in, for example, JP-A No. 7-62065 and the like) and the like), ene/thiol curing groups (described in, for example, JP-A No. 2003-20334 and the like), hydrosilylated curing groups (described in, for example, JP-A No. 2005-15 666 and the like) and the like), (4) resin compositions containing a rigid skeleton resin (fluorene, adamantane, isophorone and the like) (described in, for example, JP-A No. 9-137043 and the like), (5) resin compositions containing two monomers of different polymerizabilities thereby forming an interpenetrating polymer network structure (so called IPN structure) (described in, for example, JP-A No. 2006-131868 and the like), (6) resin compositions containing an expansible substance (described in, for example, JP-A No. 2004-2719, JP-A No. 2008-238417 and the like), and the like, and these compositions can be suitably used in the present invention. It is preferable to use some of the above-described cure shrinkage reducing means together (for example, resin compositions containing fine particles and a prepolymer having a ring-opening polymerizable group, and the like) from the standpoint of optimization of physical properties.

The wafer level lens of the present invention contains resin compositions having higher and lower two different Abbe's numbers.

The resin of the higher Abbe's number side has an Abbe's number (vd) of preferably 50 or more, more preferably 55 or more, particularly preferably 60 or more. The refractive index (nd) is preferably 1.52 or more, more preferably 1.55 or more, particularly preferably 1.57 or more.

As such resins, aliphatic resins are preferable, and particularly, resins having an alicyclic structure (for example, resins having a cyclic structure such as cyclohexane, norbornane, adamantane, tricyclodecane, tetracyclododecane and the like, specifically, resins described in, for example, JP-A No. 10-152551, JP-A Nos. 2002-212500, 2003-20334, 2004-210932, 2006-199790, 2007-2144, 2007-284650 and 2008-105999, and the like) are preferable.

The resin of the lower Abbe's number side has an Abbe's number (vd) of 30 or less, more preferably 25 or less, particularly preferably 20 or less. The refractive index (nd) is preferably 1.60 or more, more preferably 1.63 or more, particularly preferably 1.65 or more.

As such resins, resins having an aromatic structure are preferable, and for example, resins containing a structure of 9,9'-diarylfluorene, naphthalene, benzothiazole, benzotriazole and the like (specifically, resins described in, for example, JP-A No. 60-38411, JP-A No. 10-67977, JP-A Nos. 2002-47335, 2003-238884, 2004-83855, 2005-325331 and 2007-238883, International Publication WO 2006/095610, Japanese Patent No. 2537540 and the like; etc.) are preferable.

It is preferable to disperse inorganic fine particles in a matrix in the resin of the present invention, for the purpose of enhancing refractive index and for the purpose of controlling Abbe's number. Examples of the inorganic fine particles include oxides fine particles, sulfides fine particles, selenide fine particles and telluride fine particles. More specific examples thereof include fine particles of zirconium oxide, titanium oxide, zinc oxide, tin oxide, niobium oxide, cerium oxide, aluminum oxide, lanthanum oxide, yttrium oxide, zinc sulfide and the like.

Particularly in the above-described resin of higher Abbe's number, fine particles of lanthanum oxide, aluminum oxide, zirconium oxide and the like are preferably dispersed, and in the resin of lower Abbe's number, fine particles of titanium oxide, tin oxide, zirconium oxide and the like are preferably dispersed. The inorganic fine particles may be used singly or in combination of two or more of them. A composite composed of several components may also be used. Further, the inorganic fine particles may be doped with a dissimilar metal, the surface layer thereof may be covered with a dissimilar metal oxide such as silica, alumina and the like, or the surface thereof may be modified with a silane coupling agent, a titanate coupling agent, an organic acid (carboxylic acids, sulfonic acids, phosphoric acids, phosphonic acids and the like) or a dispersing agent having an organic acid group, or the like, for the purpose of reducing photocatalytic activity, reducing water absorption coefficient, and the like. The number average particle size of the inorganic fine particles may be usually 1 nm to 1000 nm, and when the number average particle size is too small, the properties of the substance may change in some cases, while when too large, an influence by Rayleigh scattering becomes remarkable, thus it is preferably 1 nm to 15 nm, further preferably 2 nm to 10 nm, particularly preferably 3 nm to 7 nm. It is desirable that the inorganic fine particles have narrower particle size distribution. Though the definition methods of such monodispersed particles are various, for example, the numerical value prescription range as described in JP-A No. 2006-160992 is a preferable particle size distribution range. The above-described number-average primary particle size can be measured, for example, by an X-ray diffraction (XRD) instrument, a transmission electron microscope (TEM) and the like. The refractive index of the inorganic fine particles is preferably 1.90 to 3.00, further preferably 1.90 to 2.70, particularly preferably 2.00 to 2.70 at a temperature of 22° C. and a wavelength of 589 nm. The content of the inorganic fine particles in the resin is preferably 5 wt % or more, further preferably 10 to 70 wt %, particularly preferably 30 to 60 wt %, from the standpoint of transparency and enhanced refractive index.

For uniformly dispersing fine particles in the resin composition, it is desirable to disperse fine particles by appropriately using, for example, dispersing agents containing a functional group having reactivity with a resin monomer forming a matrix (described in, for example, JP-A No. 2007-238884 examples, and the like), block copolymers constituted of a hydrophobic segment and a hydrophilic segment (described in, for example, JP-A No. 2007-211164), resins having a functional group which is capable of forming any chemical bond to the inorganic fine particles at the polymer end or side chain (described in, for example, JP-A No. 2007-238929, JP-A No. 2007-238930 and the like), and the like.

In the resin composition used in the present invention, additives such as known releasing agents such as silicon compounds, fluorine-based compounds, long chain alkyl group-containing compounds and the like and antioxidants such as hindered phenol and the like may be appropriately blended.

In the curable resin composition of the present invention, curing catalysts or initiators can be blended if necessary. Specifically, compounds promoting a curing reaction (radical polymerization or ion polymerization) by the action of heat or active energy ray described in, for example, JP-A No. 2005-92099 (paragraph numbers [0063] to [0070]) and the like are mentioned. The addition amount of these curing reaction promoting agents varies depending on the kind of the catalyst and the initiator and difference in the curing reactive site and the like and cannot be commonly determined, and in general, it is preferably about 0.1 to 15 wt %, more preferably about 0.5 to 5 wt % with respect to the total solid content of the curing reactive resin composition.

The curing resin composition of the present invention can be produced by appropriately blending the above-described components. When other components can be dissolved in a liquid-state low molecular weight monomer (reactive diluent) and the like, there is no necessity to separately add a solvent, while when this case is not applicable, a curable resin composition can be produced by dissolving constituent components using a solvent. The solvent which can be used in the curable resin composition is not particularly restricted and can be appropriately selected providing that it causes no precipitation of the composition and gives uniform dissolution or dispersion, and specific examples thereof include ketones (for example, acetone, methyl ethyl ketone, methyl isobutyl ketone and the like), esters (for example, ethyl acetate, butyl acetate and the like), ethers (for example, tetrahydrofuran, 1,4-dioxane and the like), alcohols (for example, methanol, ethanol, isopropyl alcohol, butanol, ethylene glycol and the like), aromatic hydrocarbons (for example, toluene, xylene and the like), water and the like. When the curable composition contains a solvent, it is preferable that the composition is cast on a substrate and/or a mold, the solvent is dried, then, a mold shape transfer operation is carried out.

Though the shape of the lens 10 is concave in the above-described procedure, this shape is not particularly restricted, and a convex shape and an aspherical shape may also be used. In the above-described procedure, the wafer level lens has a lens module having a plurality of lenses 10 molded on one surface of the substrate 1, however, a constitution of a lens module having a plurality of lenses molded on both surfaces thereof may also be used, and in this case, the black resist layers 14 are formed with a pattern having an opening at a part intersecting the optical axis of a lens on both surfaces of the lens module.

Figure 8:
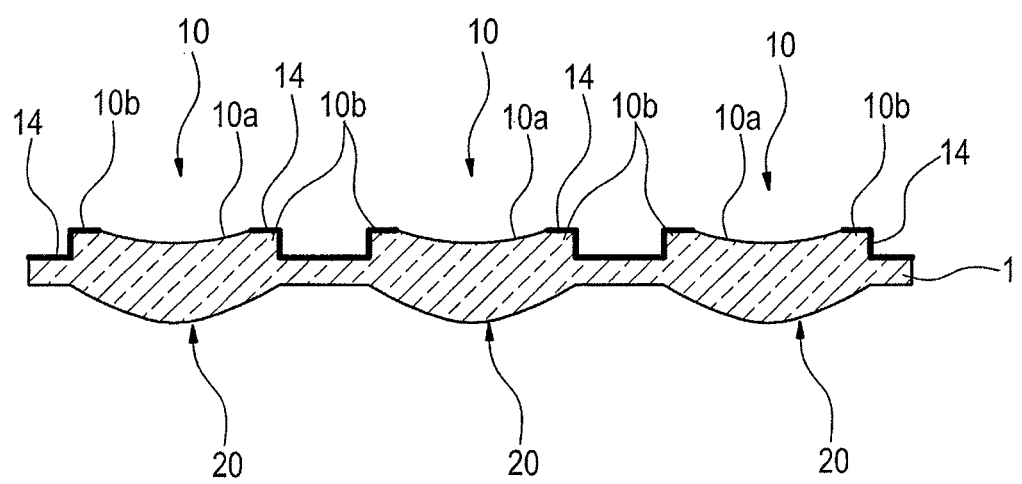
FIG. 8 is a view showing another constitution example of a wafer level lens.

FIG. 8 is a view showing another constitution example of a wafer level lens. The wafer level lens of FIG. 8 has a constitution (monolithic type) having a lens module in which the substrate 1 and the lenses 10 are molded simultaneously from the same molding material. As the molding material, the same material as described above can be used. In this example, a plurality of concave-shaped lenses 10 are formed on one surface (upper side surface in the figure) of the substrate 1 and a plurality of convex-shaped lenses 20 are formed on another surface (lower side surface in the figure). The black resist layer 14 is patterned on regions excluding the lens surface 10*a* on the surface of the lens module, that is, the surface of the substrate part and the surface of the lens marginal part 10*b*. For patterning of the black resist layer 14, the procedure as describe above can be applied.

Next, another procedure for patterning the black resist layer will be explained. In the above-described example, the black resist layer is patterned on the substrate carrying thereon lenses, while in the procedure explained below, a black resist layer is patterned on a substrate, then, lenses are molded on the substrate.

Figure 9A:
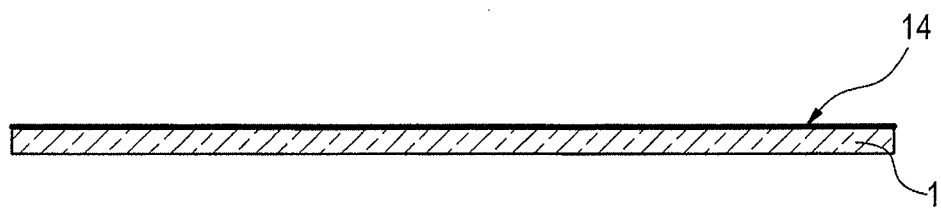
FIG. 9A to FIG. 9C are views showing another procedure of patterning of a black resist layer.
Figure 9B:
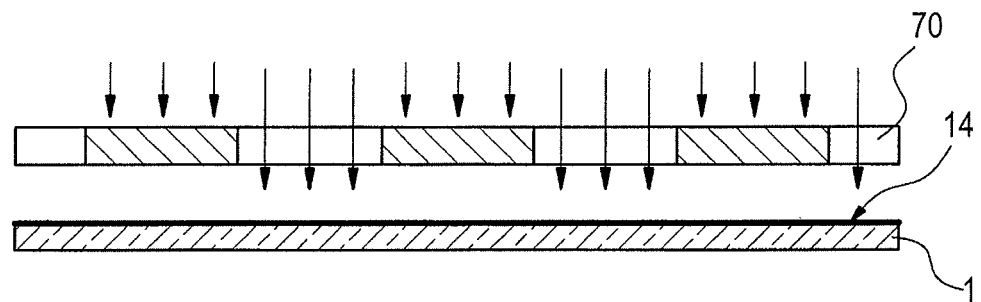
Figure 9C:
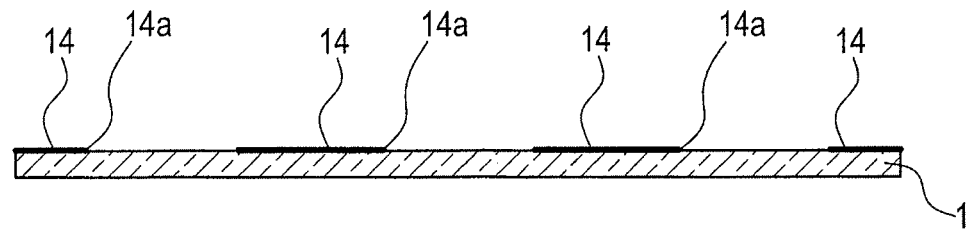
Figure 10A:
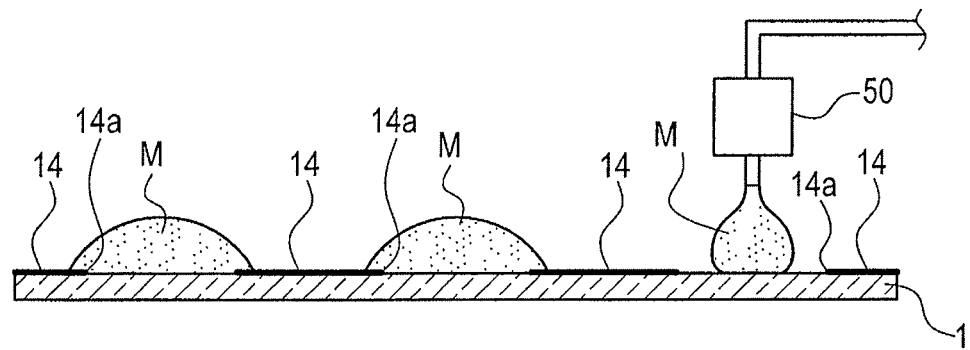
FIG. 10A to FIG. 10C are views showing a procedure of molding lenses on a substrate carrying thereon a patterned black resist layer.
Figure 10B:
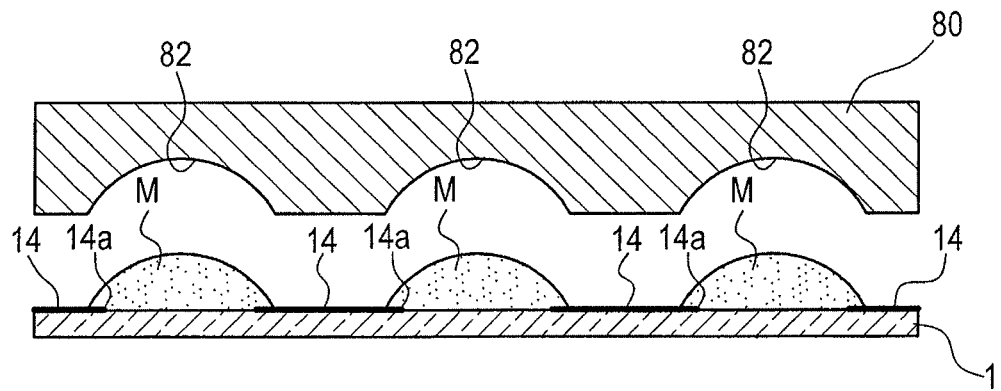
Figure 10C:
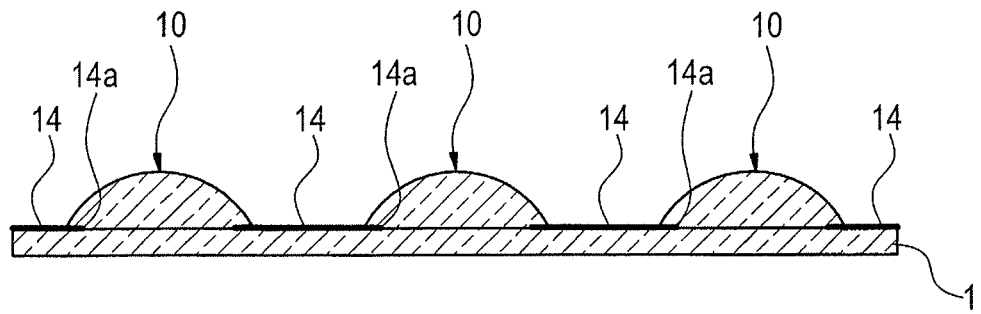

FIG. 9A to FIG. 9C are views showing another procedure of patterning of a black resist layer. FIG. 10A to FIG. 10C are views showing a procedure of molding lenses on a substrate carrying thereon a patterned black resist layer.

First, a black resist layer forming step of spray-coating a black resist composition on the substrate 1 to form the black resist layer 14 composed of the resist composition as shown in FIG. 9A is carried out.

Then, the black resist layer 14 coated on the substrate 1 is dried by a hot plate, an oven and the like at a temperature of 50° C. to 140° C. for 10 seconds to 300 seconds. The dried thickness of the black resist layer can be arbitrarily selected according to desired performances such as a light shielding property and the like, and is generally in the range of 0.1 μm or more and less than 50 μm.

Next, an exposing step is carried out in which the black resist layer 14 formed in the black resist layer forming step is exposed in the form of pattern via a mask 70 as shown in FIG. 9B. The mask 70 has a prescribed mask pattern. In exposure of this step, pattern exposure of the black resist layer 14 can be carried out by curing only parts irradiated with a light of the black resist layer 14. Here, a mask pattern is used which allows irradiation with a light only of the black resist layer 14 at regions excluding a position of the lens opening 14*a* of the lens 10 when the lens 10 is molded in a latter step. By this, only regions of the black resist layer 14 excluding a position of the lens opening 14a of the lens 10 are cured by light irradiation. As radiations which can be used in exposure, ultraviolet rays such as g line, h line, i line and the like are preferably used as in the above-described procedure.

Next, by carrying out an alkali developing treatment (developing step), only the resist layer of a region corresponding to the lens opening 14a of the lens 10 which is not cured by the above-described exposure is dissolved in an alkali aqueous solution. In contrast, the photo-cured black resist layer 14 at regions excluding the region of the lens opening 14a of the lens 10 remain on the substrate (see, FIG. 9C). As the alkali agent, the same agent as used in the procedure as described above can be used. Then, an excess developing liquid is removed by washing, and drying is carried out.

After carrying out the above-described black resist layer forming step, exposing step and developing step in the production method of this example, a curing step of curing the formed shielding pattern by the above-described post bake and/or exposure may also be contained, if necessary.

Next, the molding material M constituting the lens 10 is dropped by the dispenser 50 on the substrate 1 on which the black resist layer 14 has been patterned, as shown in FIG. 10A. The molding material M is fed so as to cover a region corresponding to the lens opening 14A of the lens 10 and to partially include the end of the black resist layer 14 adjacent to the opening.

After feeding the molding material M on the substrate 1, a mold 80 for molding a lens is disposed as shown in FIG. 10B. On the mold 80, concave portions 82 for transferring the shape of the lens 10 are provided corresponding to the number of desired lenses 10.

The mold 80 is pushed to the molding material M on the substrate 1, thereby deforming the molding material M to correspond to the shape of the concave portion. Under the condition of pushing the mold 80 to the molding material M, heat or ultraviolet ray is irradiated from the outside of the mold to cure the molding resin M when the molding resin M is a thermosetting resin or an ultraviolet curable resin.

After molding of the molding material M, the substrate 1 and the lens 10 can be released from the mold 80, to obtain a wafer level lens having the black resist layer 14 patterned on the substrate 1, as shown in FIG. 10C.

The black resist layer 14 formed on the wafer level lens is not limited to the patterned form at a region excluding the lens surface 10a of the lens 10 on the surface of the lens module, and as shown in FIG. 10C, the lens opening 14a may also be formed at a part intersecting the optical axis of the lens 10 on the surface of the substrate. In the example of FIG. 10C, the black resist layer 14 functions as an optical diaphragm in the lens module, and the diameter of the lens opening 14a is the effective diameter of the lens 10.

In this wafer level lens, an incident light can be shielded by the black resist layer 14 of low reflection rate patterned on the surface of the lens module or the surface of the substrate, and reflection of lights in the lens module and between the lens modules can be suppressed. Because of this constitution, generation of defects such as ghosts and flares due to a reflected light in taking an image can be prevented when applied to an imaging module having an imaging device.

Since the black resist layer 14 is patterned on the surface of the substrate, there is no necessity to attach another light shielding member and the like to the wafer level lens and an increase in the production cost can be suppressed.

When a construction having an uneven surface is disposed around a lens as in a structure shown in patent document 2, there is a fear of tendency of generation of defects such as ghosts and the like by reflection or radiation of an incident light in the construction. In contrast, since the black resist layer 14 is patterned on a region excluding the lens surface 10a of the lens 10 as shown in FIG. 2 in the wafer level lens of the present invention, a light can be shielded at regions other than the lens surface 10a and optical performances can be improved.

Next, the transmittance and the reflection rate of the black resist layer were measured.

Figure 11A:
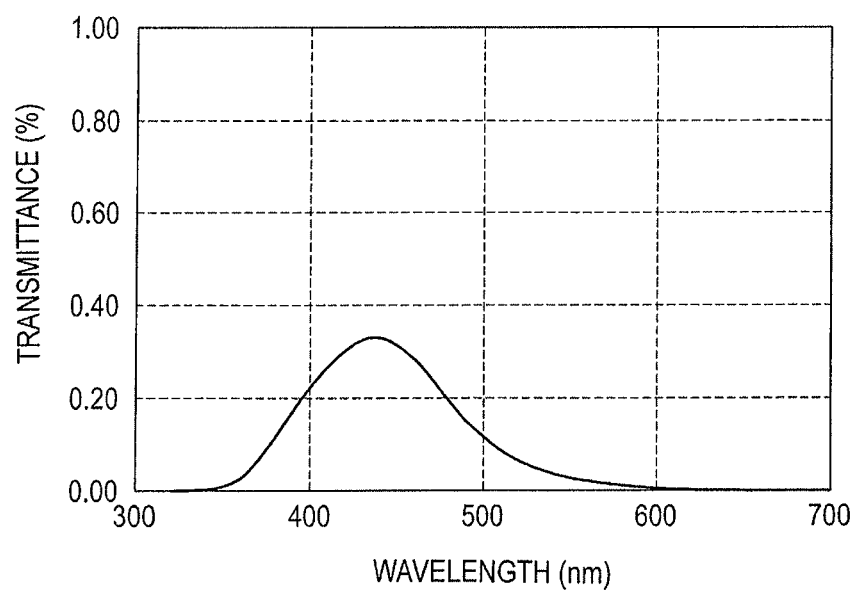
FIG. 11A and FIG. 11B are graphs showing the transmittance and the reflection rate against the wavelength of an incident light at a black resist layer.

FIG. 11A is a transmission spectrum showing the transmittance against the wavelength of an incident light. Here, the black resist layer is formed with an average thickness of 3 μm by spray coating on a glass wafer. As shown in FIG. 11A, it is found that the transmittance of the black resist can be suppressed to 0.4% or less for a visible light having a wavelength of 400 to 700 nm.

Figure 11B:
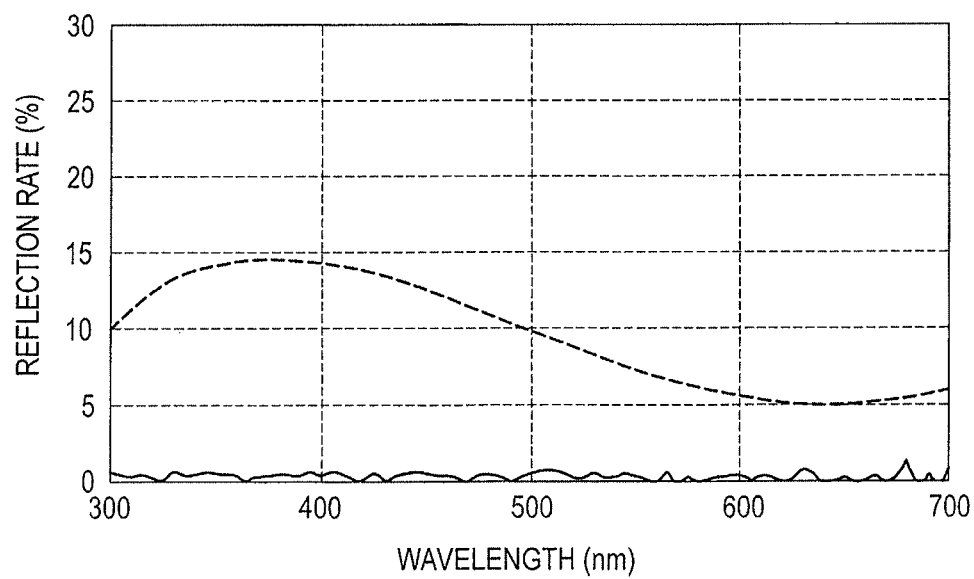

FIG. 11B is a graph showing the reflection rate against the wavelength of an incident light. Here, a film on which chromium was vapor-deposited and a film on which chromium was spray-coated were prepared, and a reflected light was measured along a direction inclined by 5° from the vertical direction to the glass wafer surface. In FIG. 11B, the graph of the vapor-deposited film is shown by a dashed line, and the graph of the spray-coated film is shown by a dashed line. As shown in FIG. 11B, it is found that the reflection rate of the spray-coated film can be lower than that of the vapor-deposited film for a visible light having a wavelength of 400 to 700 nm, and its reflection rate can be suppressed to 1% or less. Further, it is found preferable to form a black resist layer particularly by spray coating.

Next, another constitution example of the wafer level lens will be explained.

Figure 12:
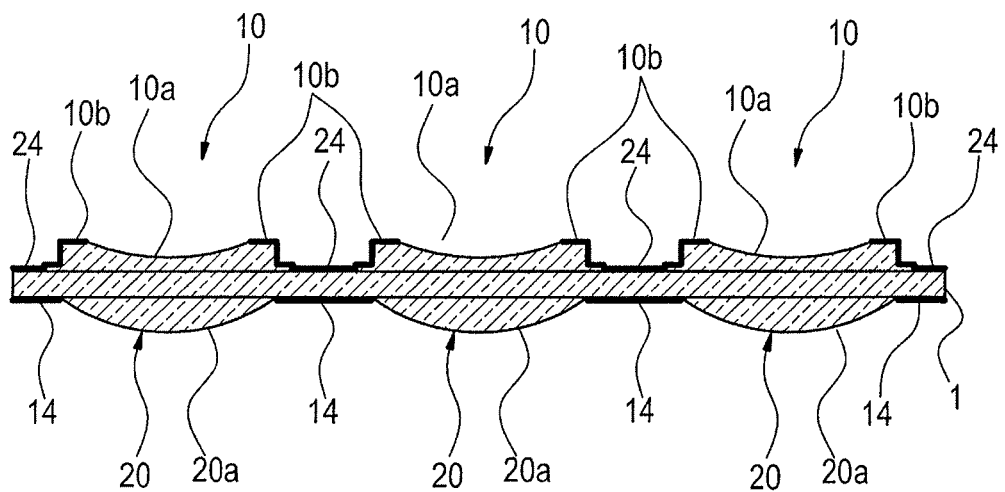
FIG. 12 is a cross-sectional view showing another constitution example of a wafer level lens.

FIG. 12 is a cross-sectional view showing another constitution example of the wafer level lens. FIG. 12 is a cross-sectional view corresponding to the line A-A cross-sectional view of the wafer level lens shown in FIG. 1.

As shown in FIG. 12, a plurality of concave-shaped lenses 10 are disposed on one surface of the substrate 1, and a plurality of lenses 20 having a lens surface 20a protruding in a convex shape are disposed on another surface thereof. The lens 10 has a concave-shaped lens surface 10a and a lens marginal part 10b around the lens surface 10a. Here, the lens surface 10a has an optical property of concentrating or radiating an incident light in the lens 10 toward a desired direction, and the curvature and the surface shape thereof are designed in view of this optical property. In this example, the height of the lens marginal part 10b from the substrate 1 is higher than the center of the lens surface 10a.

This lens module is molded so that the optical axis of each lens 10 on one surface of the substrate and the optical axis of the lens 20 on another surface thereof coincide.

The shape of the lenses 10 and 20 is not particularly restricted, and for example, a lens having a lens surface 10a protruding in a convex shape, that is, a convex-shaped lens may be used, or an aspherical lens may also be used.

In this lens module, a light shielding layer 24 is provided so as to cover the surface of the lens marginal part 10b of the lens 10 and the surface of the substrate 1 between the lenses 10. The light shielding layer 24 is patterned on a region excluding the lens surface 10a of the lens 10, on the surface of the lens module. When the wafer level lens has a constitution of lamination of two or more lens modules, the light shielding layer 24 is provided on the surface of the lens module situated at the outermost position of the incident side. The light shielding layer 24 is formed with a pattern having an opening at a part intersecting the optical axis of the lens 10. The light shielding layer 24 may partially cover a peripheral part of the lens surface 10a.

The light shielding layer 24 has a reflection rate of 4% or less and a transmittance of 0.1% or less for a visible light having a wavelength of 400 to 700 nm.

The light shielding layer 24 contains a metal material, and has lower transmittance and higher reflection rate for a visible light than that of a low reflection light shielding layer described later. Since the light shielding layer 24 is disposed on a region other than the lens surface 10a of the lens 10 of the substrate 1, it has a function of reflecting a light irradiated on regions other than the lens surface 10a. By this constitution, an incident light is shielded on regions other than the lens surface 10a of the lens 10 by the light shielding layer 24. The metal material contained in the light shielding layer 24 will be described later.

A low reflective light shielding layer 14 is disposed on a region excluding the lens surface 20a of the lens 20, on the surface opposite to the surface carrying thereon the light shielding layer 24 of the lens module. The low reflective light shielding layer 14 may partially cover a peripheral part of the lens surface 20a.

Since the low reflective light shielding layer 14 is constituted of the above-described black resist layer and has a light reflection rate lower than that of a metal layer and the like, disadvantages such as ghosts, flares and the like due to light reflection can be reduced.

Figure 13:
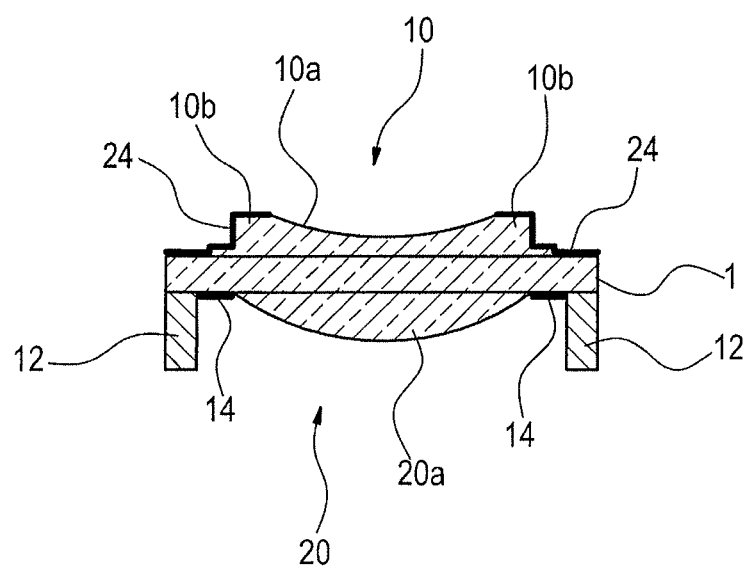
FIG. 13 is a cross-sectional view showing a deformed example of the wafer level lens shown in FIG. 12.

FIG. 13 is a cross-sectional view showing a deformed example of the wafer level lens shown in FIG. 12. FIG. 13 shows a condition obtained by connecting a spacer to the substrate 1 of the lens module, then, providing one lens 10 and one lens 20 on the substrate 1 by dicing. The optical axis of the lens 10 and the optical axis of the lens 20 coincide. The spacer 12 may also be integrally molded to the substrate 1 as a part of the substrate 1. This lens module can be connected to another lens module sandwiching the spacer 12. This lens module can be connected to a sensor substrate sandwiching the spacer 12.

In the constitution shown in FIG. 13, the light shielding layer 24 is disposed on a region excluding the lens surface 10a of the lens 10, on the surface of the light incident side of the lens module. On the surface of the substrate 1 on which the lens 20 is disposed, the low reflective light shielding layer 14 is formed with a pattern having an opening at the lens surface 20a of the lens 20.

Figure 14:
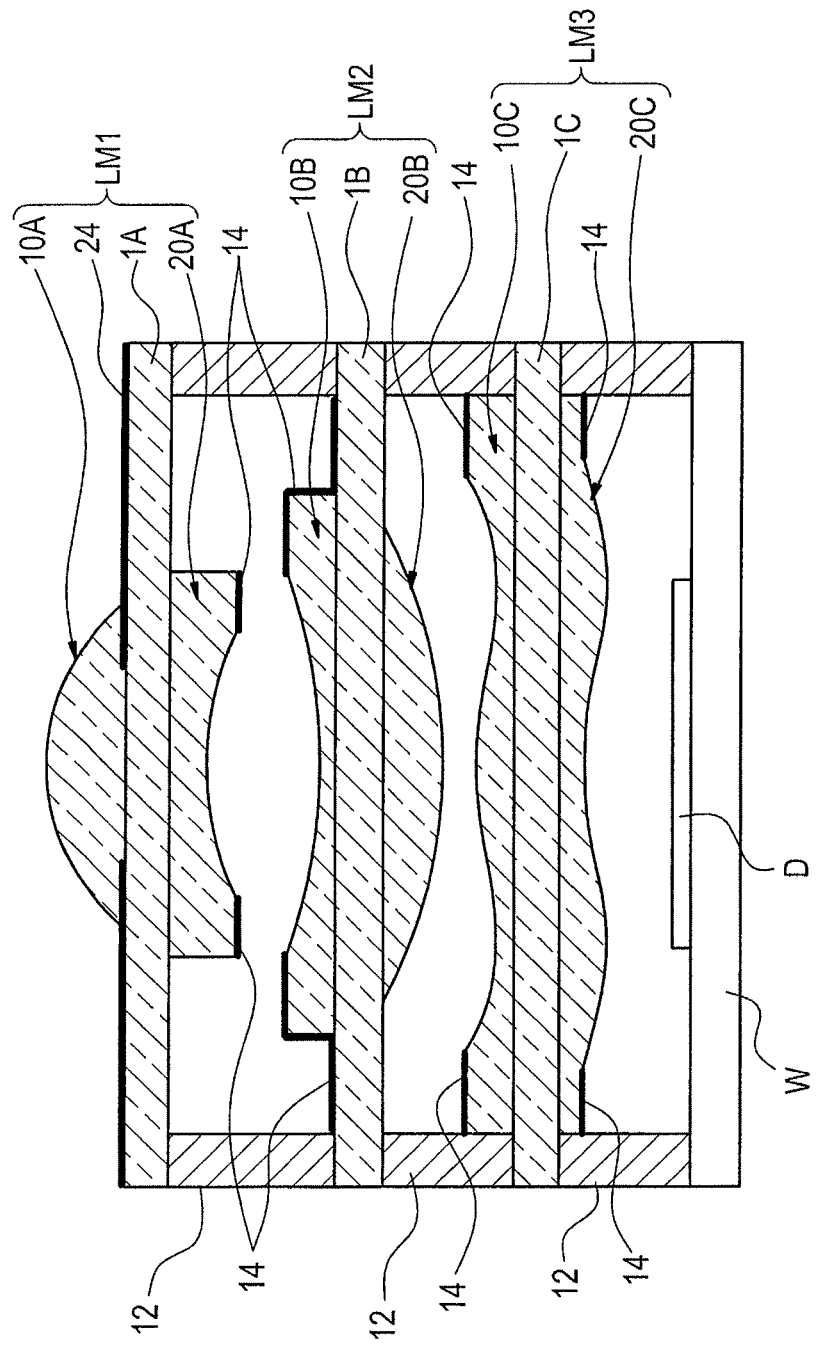
FIG. 14 is a cross-sectional view showing an imaging unit having the lens modules of FIG. 12.

FIG. 14 is a cross-sectional view showing an imaging unit having the lens modules of FIG. 12.

In the lens module LM1, a convex-shaped lens 10A is molded on the upper surface of the substrate 1A, and a lens 20A having a concave-shaped lens surface is molded on the lower surface. On the upper surface of the substrate 1A, a light shielding layer 24 is patterned on a region excluding the lens surface of the lens 10A. On the lens 20A, a low reflective light shielding layer 14 is patterned on a region excluding the lens surface. Here, the upper surface of the lens module LM1 is the light incident side outermost surface. The light shielding layer 24 is disposed on at least a part of this surface. The shape of patterning of the low reflective light shielding layer 14 and the light shielding layer 24 is not restricted, and the low reflective light shielding layer 14 and the light shielding layer 24 may be formed with a pattern having an opening at a part intersecting the optical axis of the lens, and the same shall apply to the low reflective light shielding layer 14 of the lens modules LM2 and 3.

In the lens module LM2, a concave-shaped lens 10B is molded on the upper surface of the substrate 1B, and a lens 20B having a convex-shaped lens surface is molded on the lower surface. This lens module LM2 has basically the same constitution as shown in FIG. 3. A patterned low reflective light shielding layer 14 is disposed on a region excluding the lens surface of the lens 10B on the surface of the lens module LM2, that is, on the lens marginal part and a region of no lens 10B on the surface of the substrate 1B. In this example, the low reflective light shielding layer 14 is not disposed on the lower surface of the substrate 1B, however, a patterned low reflective light shielding layer 14 may be disposed on a region excluding the lens surface of the lens 20B.

In the lens module LM3, an aspherical-shaped lens 10C is molded on the upper surface of the substrate 1C, and a lens 20C having an aspherical-shaped lens surface is molded on the lower surface. On both surfaces of the lens module LM3, the patterned low reflective light shielding layer 14 is disposed on a region excluding the lens surfaces of the lens 10C and the lens 20C. The low reflective light shielding layer 14 may be provided on the surfaces of the substrates 1A, 1B and 1C of the lens modules LM1, LM2 and LM3, respectively, or may be provided on some of the surfaces of the substrates 1A, 1B and 1C. The low reflective light shielding layer 14 may advantageously be formed with a pattern having an opening at a part intersecting the optical axis of the lenses 10A, 10B and 10C, on the surfaces of the lens modules LM1, LM2 and LM3 or the surfaces of the substrates 1A, 1B and 1C.

In this imaging unit, other members and constitutions are as shown in FIG. 4.

In the case of a constitution of lamination of the lens modules LM1, LM2 and LM3 as shown in FIG. 14, the light shielding layer 24 is provided on the surface of the top lens module LM1 closest to the light incident side or on the surface of the substrate 1A. The light shielding layer 24 has lower transmittance and higher light reflection rate than the low reflective light shielding layer 14, and has a reflection rate of 4% or less and a transmittance of 0.1% or less for a visible light having a wavelength of 400 to 700 nm.

The light shielding layer 24 is formed on an at least partial region of the surface of the lens module LM1 situated at the light incident side outermost position. As shown in FIG. 14, the light shielding layer 24 is formed with a pattern having an opening at a part intersecting the optical axis of the lens, on the surface of the substrate of the lens module LM1 situated at the light incident side outermost position, and its opening may function as an optical diaphragm corresponding to the effective diameter of the lens A.

This wafer level lens has the light shielding layer 24 and the low reflective light shielding layer 14. The light shielding layer 24 has a function of preventing transmission of a light in the substrate, by reflecting a light incoming from the outside of the wafer level lens. Particularly when a plurality of substrates are disposed, a light incoming from the top substrate surface is reflected by the light shielding layer 24 at a region other than the lens, and it is possible to prevent the light penetrated through a region other than the lens from penetrating between the substrates and to the sensor substrate side.

By providing the low reflective light shielding layer 14, transmission of a light at a region other than the lens surface of the lens can be prevented.

By providing both the light shielding layer 24 and the low reflective light shielding layer 14, a light penetrating a part other than the lens can be reflected by the light shielding layer 24, and even if a light penetrates into the substrate without reflection by the light shielding layer 24, the light can be shielded by the low reflective light shielding layer 14. Accordingly, generation of light transmission and reflection at a region other than the lens surface of the lens can be prevented, and defects in optical performances such as ghosts and flares in taking an image can be suppressed.

Further, since the light shielding layer 24 and the low reflective light shielding layer 14 are formed on the surface of the substrate, there is no necessity to attach another light shielding member and the like to the wafer level lens and an increase in the production cost can be suppressed.

The low reflective light shielding layer 14 can be formed by the same procedure as for the above-described black resist layer. That is, before formation of a lens on a substrate, a black resist layer is coated on the surface of the substrate, the coated black resist layer is formed with a pattern having an opening at a part intersecting the optical axis of the lens, then, the lens is integrally molded with the substrate, thus, the low reflective light shielding layer can be formed.

Alternatively, the low reflective light shielding layer may also be obtained by a method in which the above-described lens is molded on a substrate, a black resist layer is coated on the lens surface of the lens and the surface of the substrate, and the black resist layer is formed with a pattern having an opening at a part intersecting the optical axis of the lens. Also the light shielding layer can be formed by the same manner as for the low reflective light shielding layer.

It is preferable that the low reflective light shielding layer is formed particularly by spray coating as shown in FIG. 11.

The present specification discloses the following contents.

(1) A wafer level lens having at least one lens module having a substrate and a plurality of lenses formed on said substrate, in which the wafer level lens has a black resist layer formed on the surface of said lens module or on the surface of said substrate, and said black resist layer is formed with a pattern having an opening at a part intersecting the optical axis of said lens.

(2) A wafer level lens having at least one lens module having a substrate and a plurality of lenses formed on said substrate, in which the wafer level lens has a light shielding layer formed on an at least partial region of the light incidence side outermost surface of said lens module and a low reflective light shielding layer formed with a pattern having an opening at a part intersecting the optical axis of said lens, on the surface of said lens module or on the surface of said substrate other than said light incidence side outermost surface, and said light shielding layer has lower transmittance for a visible light and higher reflection rate than said low reflective light shielding layer.

(3) The wafer level lens according to (2), in which said low reflective light shielding layer is a black resist layer.

(4) The wafer level lens according to (1) or (3), in which said black resist layer is formed using a black resist composition.

(5) The wafer level lens according to any one of (1), (3) and (4), in which said black resist layer contains any one of carbon black, silver-tin and titanium black.

(6) The wafer level lens according to any one of (1), (3) to (5), in which said black resist layer has a reflection rate of 2% or less and a transmittance of 1% or less for visible light having a wavelength of 400 to 700 nm.

(7) The wafer level lens according to (2), in which said light shielding layer contains a metal material.

(8) The wafer level lens according to (2) or (7), in which said light shielding layer contains chromium.

(9) The wafer level lens according to any one of (2), (7) and (8), in which said light shielding layer has a reflection rate of 4% or less and a transmittance of 0.1% or less for visible light having a wavelength of 400 to 700 nm.

(10) The wafer level lens according to any one of (1) to (9), in which a plurality of said lens modules are laminated via a spacer formed on said substrate.

(11) An imaging unit having lens modules obtained by separating said substrate of said lens module according to any one of (1) to (10) so that each module contains said lens, an imaging device, and a sensor substrate on which said imaging device is disposed.

(12) A method of producing a wafer level lens having at least one lens module having a substrate and a plurality of lenses formed on said substrate, in which before formation of said lenses on said substrate, a black resist layer is coated on the surface of the substrate, said coated black resist layer is formed with a pattern having an opening at a part intersecting the optical axis of said lens, then, said lens is integrally molded on said substrate.

(13) A method of producing a wafer level lens having at least one lens module having a substrate and a plurality of lenses formed on said substrate, in which said lens is molded on said substrate, a black resist layer is coated on the lens surface of said lens and on the surface of said substrate, and said black resist layer is formed with a pattern having an opening at a part intersecting the optical axis of said lens.

(14) The production method of a wafer level lens according to (13), in which said black resist layer is coated by a spray coating method.

(15) The production method of a wafer level lens according to any one of (12) to (14), in which said black resist layer is patterned by photolithography.

(16) The production method of a wafer level lens according to any one of (12) to (15), in which said lens is molded on said substrate with a mold.

(17) The production method of a wafer level lens according to any one of (12) to (16), in which said black resist layer is formed using a black resist composition.

(18) The production method of a wafer level lens according to any one of (12) to (17), in which said black resist layer contains any one of carbon black, silver-tin and titanium black.

(19) The production method of a wafer level lens according to any one of (12) to (18), in which said black resist layer has a reflection rate of 2% or less and a transmittance of 1% or less for visible light having a wavelength of 400 to 700 nm.

(20) The production method of a wafer level lens according to any one of (12) to (19), in which a plurality of said lens modules are laminated via a spacer formed on said substrate.

INDUSTRIAL APPLICABILITY

The above-described wafer level lens and imaging unit can be applied in producing an imaging lens provided on an imaging part of digital cameras, endoscopic instruments, portable electronic instruments and the like.

Though the present invention was explained in detail or referring to specific embodiments, it is apparent to those skilled in the art that various changes and modifications can be made without deviating from the spirit and the scope of the present invention.

The instant application is based on Japanese Patent Application filed on Aug. 13, 2009 (Japanese Patent Application No. 2009-187858), Japanese Patent Application filed on Sep. 9, 2009 (Japanese Patent Application No. 2009-208365), Japanese Patent Application filed on Sep. 9, 2009 (Japanese Patent Application No. 2009-208366), Japanese Patent Application filed on Sep. 9, 2009 (Japanese Patent Application No. 2009-208367), Japanese Patent Application filed on Aug. 11, 2010 (Japanese Patent Application No. 2010-180625), Japanese Patent Application filed on Aug. 11, 2010 (Japanese Patent Application No. 2010-180626), Japanese Patent Application filed on Aug. 11, 2010 (Japanese Patent Application No. 2010-180627) and Japanese Patent Applica-

EXPLANATION OF MARKS

1: Substrate
10: Lens
14: Black resist layer (low reflective light shielding layer)
24: Light shielding layer

What is claimed is:

1. A wafer level lens having at least one lens module having a substrate and a plurality of lenses formed on said substrate, wherein:

the wafer level lens has a black resist layer formed on the surface of said lens module or on the surface of said substrate, the black resist layer is formed with a pattern having an opening at a part intersecting the optical axis of said lens, the black resist layer has a reflection rate of 2% or less and a transmittance of 1% or less for visible light having a wavelength of 400 to 700 nm, and the black resist layer is formed by a black resist composition comprising a dispersing resin being a graft copolymer having in a molecule a number of atoms excluding a hydrogen atom of in a range of 400 to 1000, the graft copolymer having a graft chain selected from the group consisting of a polyester structure, a polyether structure and a polyacrylate structure, and the graft polymer containing a structure unit represented by any one of formulae (1) to (5):

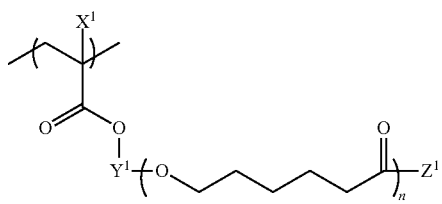

(1)

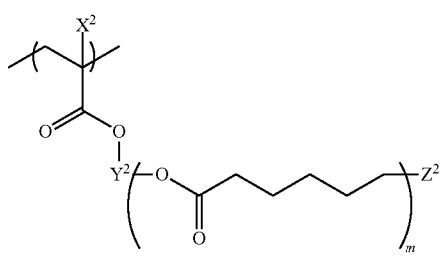

(2)

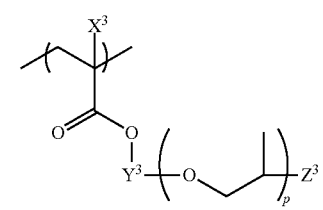

(3)

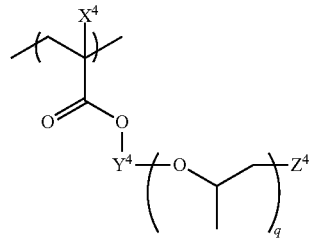

(4)

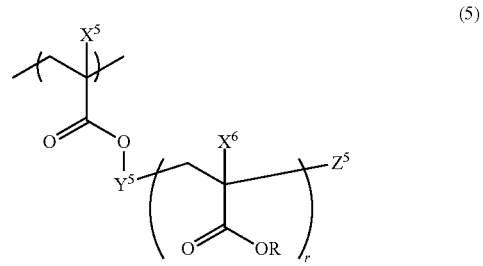

(5)

wherein in formulae (1) to (5), $X^1$, $X^2$, $X^3$, $X^4$, $X^5$ and $X^6$ each independently represents a hydrogen atom or a monovalent organic group, $Y^1$, $Y^2$, $Y^3$, $Y^4$ and $Y^5$ each independently represents a divalent connecting group, $Z^1$, $Z^2$, $Z^3$, $Z^4$ and $Z^5$ each independently represents a hydrogen atom or a monovalent organic group, R represents a hydrogen atom or a monovalent organic group, and R's may be the same or different in the graft copolymer, and n, m, p, q and r each independently represents an integer of 1 to 500.

2. A wafer level lens having at least one lens module having a substrate and a plurality of lenses formed on said substrate, wherein the wafer level lens has a light shielding layer formed on an at least partial region of the light incidence side outermost surface of said lens module and a low reflective light shielding layer formed with a pattern having an opening at a part intersecting the optical axis of said lens, on the surface of said lens module or on the surface of said substrate other than said light incidence side outermost surface, said light shielding layer has lower transmittance for a visible light and higher reflection rate than said low reflective light shielding layer, said light shielding layer has a reflection rate of 4% or less and a transmittance of 0.1% or less for visible light having a wavelength of 400 to 700 nm, and the wafer level lens further comprises a black resist layer formed by a black resist composition comprising a dispersing resin being a graft copolymer having in a molecule a number of atoms excluding a hydrogen atom of in a range of 400 to 1000, the graft copolymer having a graft chain selected from the group consisting of a polyester structure, a polyether structure and a polyacrylate structure, and the graft polymer containing a structure unit represented by any one of formulae (1) to (5):

(1)
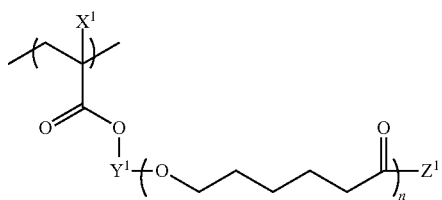

(2)
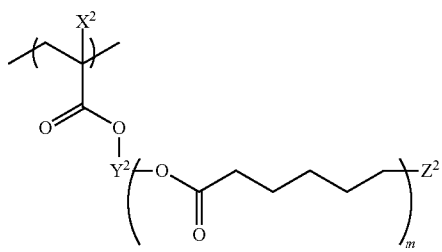

(3)
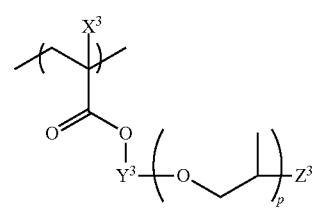

(4)
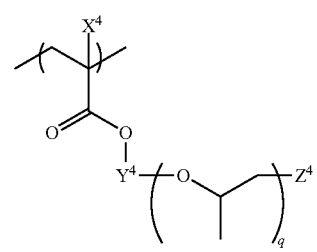

(5)
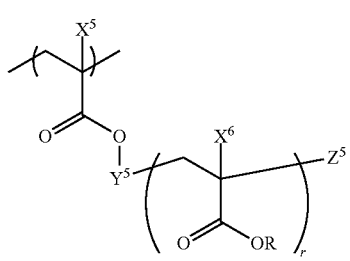

wherein in formulae (1) to (5), $X^1$, $X^2$, $X^3$, $X^4$, $X^5$ and $X^6$ each independently represents a hydrogen atom or a monovalent organic group, $Y^1$, $Y^2$, $Y^3$, $Y^4$ and $Y^5$ each independently represents a divalent connecting group, $Z^1$, $Z^2$, $Z^3$, $Z^4$ and $Z^5$ each independently represents a hydrogen atom or a monovalent organic group, R represents a hydrogen atom or a monovalent organic group, and R's may be the same or different in the graft copolymer, and n, m, p, q and r each independently represents an integer of 1 to 500.

3. The wafer level lens according to claim 2, wherein said low reflective light shielding layer is a black resist layer.

4. The wafer level lens according to claim 1, wherein said black resist layer is formed using a black resist composition.

5. The wafer level lens according to claim 1, wherein said black resist layer contains any one of carbon black, silver-tin and titanium black.

6. The wafer level lens according to claim 2, wherein said light shielding layer contains a metal material.

7. The wafer level lens according to claim 2, wherein said light shielding layer contains chromium.

8. The wafer level lens according to claim 1, wherein a plurality of said lens modules are laminated via a spacer formed on said substrate.

9. An imaging unit having
lens modules obtained by separating said substrate of said lens module according to claim 1 so that each module contains said lens,
an imaging device, and
a sensor substrate on which said imaging device is disposed.

10. A method of producing a wafer level lens having at least one lens module having a substrate and a plurality of lenses formed on said substrate,
wherein before formation of said lenses on said substrate,
a black resist layer is coated on the surface of the substrate,
said coated black resist layer is formed with a pattern having an opening at a part intersecting the optical axis of said lens, then,
said lens is integrally molded on said substrate,
further wherein said black resist layer has a reflection rate of 2% or less and a transmittance of 1% or less for visible light having a wavelength of 400 to 700 nm, and
the black resist layer is formed by a black resist composition comprising a dispersing resin being a graft copolymer having in a molecule a number of atoms excluding a hydrogen atom of in a range of 400 to 1000, the graft copolymer having a graft chain selected from the group consisting of a polyester structure, a polyether structure and a polyacrylate structure, and the graft polymer containing a structure unit represented by any one of formulae (1) to (5):

(1)
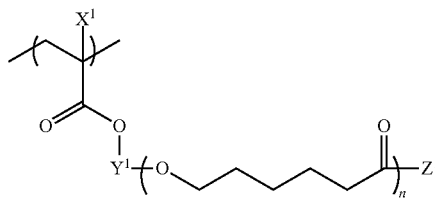

(2)
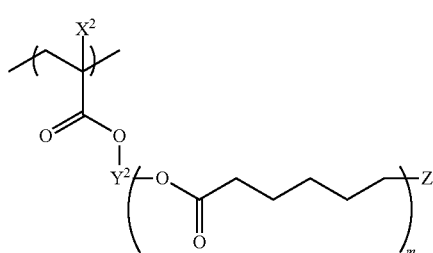

(3)
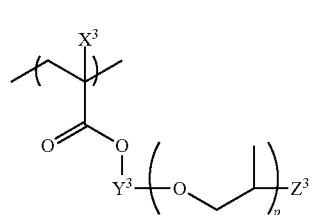

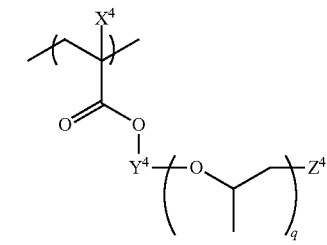

(4)

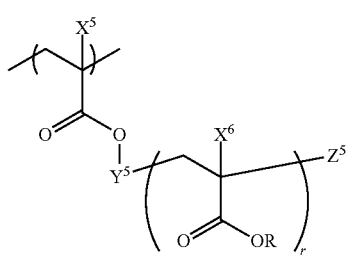

(5)

wherein in formulae (1) to (5), $X^1$, $X^2$, $X^3$, $X^4$, $X^5$ and $X^6$ each independently represents a hydrogen atom or a monovalent organic group, $Y^1$, $Y^2$, $Y^3$, $Y^4$ and $Y^5$ each independently represents a divalent connecting group, $Z^1$, $Z^2$, $Z^3$, $Z^4$ and $Z^5$ each independently represents a hydrogen atom or a monovalent organic group, R represents a hydrogen atom or a monovalent organic group, and R's may be the same or different in the graft copolymer, and n, m, p, q and r each independently represents an integer of 1 to 500.

11. A method of producing a wafer level lens having at least one lens module having a substrate and a plurality of lenses formed on said substrate, wherein said lens is molded on said substrate, a black resist layer is coated on the lens surface of said lens and on the surface of said substrate, said black resist layer is formed with a pattern having an opening at a part intersecting the optical axis of said lens, said black resist layer has a reflection rate of 2% or less and a transmittance of 1% or less for visible light having a wavelength of 400 to 700 nm, and the black resist layer is formed by a black resist composition comprising a dispersing resin being a graft copolymer having in a molecule a number of atoms excluding a hydrogen atom of in a range of 400 to 1000, the graft copolymer having a graft chain selected from the group consisting of a polyester structure, a polyether structure and a polyacrylate structure, and the graft polymer containing a structure unit represented by any one of formulae (1) to (5):

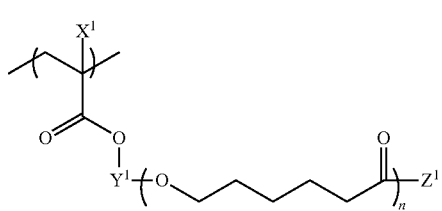

(1)

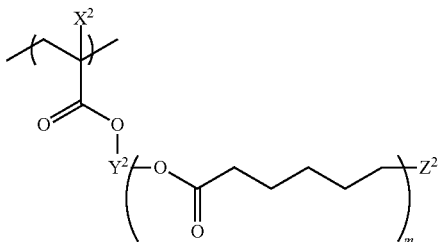

(2)

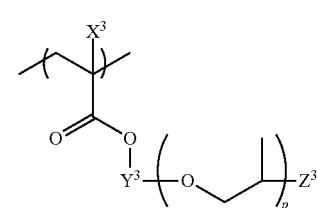

(3)

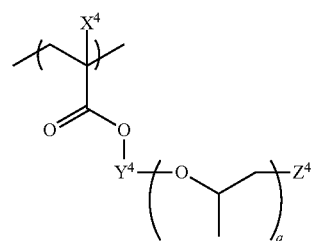

(4)

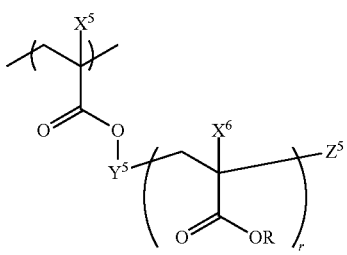

(5)

wherein in formulae (1) to (5), $X^1$, $X^2$, $X^3$, $X^4$, $X^5$ and $X^6$ each independently represents a hydrogen atom or a monovalent organic group, $Y^1$, $Y^2$, $Y^3$, $Y^4$ and $Y^5$ each independently represents a divalent connecting group, $Z^1$, $Z^2$, $Z^3$, $Z^4$ and $Z^5$ each independently represents a hydrogen atom or a monovalent organic group, R represents a hydrogen atom or a monovalent organic group, and R's may be the same or different in the graft copolymer, and n, m, p, q and r each independently represents an integer of 1 to 500.

12. The production method of a wafer level lens according to claim 11, wherein said black resist layer is coated by a spray coating method.

13. The production method of a wafer level lens according to claim 10, wherein said black resist layer is patterned by photolithography.

14. The production method of a wafer level lens according to claim 10, wherein said lens is molded on said substrate with a mold.

15. The production method of a wafer level lens according to claim 10, wherein said black resist layer is formed using a black resist composition.

16. The production method of a wafer level lens according to claim 10, wherein said black resist layer contains any one of carbon black, silver-tin and titanium black.

17. The production method of a wafer level lens according to claim 10, wherein a plurality of said lens modules are laminated via a spacer formed on said substrate.

18. The wafer level lens according to claim 1, wherein the black resist composition contains an oxime compound as a photopolymerization initiator.

19. The wafer level lens according to claim 2, wherein the black resist composition contains an oxime compound as a photopolymerization initiator.

20. The production method of a wafer level lens according to claim 10, wherein the black resist composition contains an oxime compound as a photopolymerization initiator.

21. The production method of a wafer level lens according to claim 11, wherein the black resist composition contains an oxime compound as a photopolymerization initiator.

22. The production method of a wafer level lens according to claim 12, wherein
   said black resist layer is formed using a black resist composition, and
   the thickness of the black resist composition directly after the spray coating is 0.2 µm, to 10 µm.

23. The production method of a wafer level lens according to claim 12, wherein
   said black resist layer is formed using a black resist composition having a solids content of 10% to 40%, and
   in the spray-coating, the black resist composition is coated at a rate of 0.01 cc to 10 cc per minute, and is spray-coated at a distance of from 1 cm to 30 cm from the substrate.

* * * * *